(12) United States Patent
Christensen et al.

(10) Patent No.: US 9,355,405 B2
(45) Date of Patent: *May 31, 2016

(54) SYSTEM AND METHOD FOR ADVERTISEMENT TRANSMISSION AND DISPLAY

(71) Applicant: StratosAudio, Inc., Kirkland, WA (US)

(72) Inventors: Kelly M. Christensen, Mill Creek, WA (US); John Phillip Hansen, Austin, TX (US); Thomas Daniel Mock, Sheffield, PA (US)

(73) Assignee: STRATOSAUDIO, INC., Kirkland, WA (US)

( * ) Notice: Subject to any disclaimer, the term of this patent is extended or adjusted under 35 U.S.C. 154(b) by 234 days.

This patent is subject to a terminal disclaimer.

(21) Appl. No.: 13/952,506

(22) Filed: Jul. 26, 2013

(65) Prior Publication Data

US 2013/0311278 A1 Nov. 21, 2013

Related U.S. Application Data

(63) Continuation of application No. 13/452,783, filed on Apr. 20, 2012, now Pat. No. 8,516,017, which is a continuation of application No. 12/366,535, filed on Feb. 5, 2009, now Pat. No. 8,166,081.

(60) Provisional application No. 61/026,449, filed on Feb. 5, 2008.

(51) Int. Cl.
*G06F 17/30* (2006.01)
*G06Q 30/02* (2012.01)
(Continued)

(52) U.S. Cl.
CPC ............ *G06Q 30/0251* (2013.01); *G06Q 30/02* (2013.01); *G06Q 30/0272* (2013.01);
(Continued)

(58) Field of Classification Search
None
See application file for complete search history.

(56) References Cited

U.S. PATENT DOCUMENTS 4,926,255 A 5/1990 Von Kohorn
5,134,719 A 7/1992 Mankovitz
(Continued)

FOREIGN PATENT DOCUMENTS

CA 2 316 925 7/1999
DE 44 27 046 A1 2/1996
(Continued)

OTHER PUBLICATIONS

"Bookmark Your World", 1999-2000 Xenote, www.xenote.com.
(Continued)

*Primary Examiner* — Belix M Ortiz Ditren
(74) *Attorney, Agent, or Firm* — Knobbe Martens Olson & Bear LLP

(57) ABSTRACT

The disclosure herein provides systems and methods for a media enhancement system configured to associate a secondary media signal (for example, the secondary media signal can comprise an advertisement) to a primary media signal (for example, a radio broadcast). The disclosure herein additionally provides systems and methods for a media enhancement system that enables the generating, transmitting, displaying, and/or responding to a plurality of associated and/or unassociated secondary media signals, based on a primary media content from a primary media signal, user characteristics (for example, demographic and/or geographic information), and/or third-party preferences (for example, the goals of advertisers). The secondary media signals can be used to enhance the primary media content already being provided to the user on a user device. The secondary media signals can also be used to create psychological associations or relationships with the primary media content already being provided to the user.

20 Claims, 14 Drawing Sheets

(51) Int. Cl.

| | | |
|---|---|---|
| G11C 7/10 | (2006.01) | |
| G11C 7/22 | (2006.01) | |
| G11C 11/4076 | (2006.01) | |
| G11C 11/4096 | (2006.01) | |
| H04L 29/08 | (2006.01) | |

(52) U.S. Cl.
CPC ............ *G11C7/1066* (2013.01); *G11C 7/1078* (2013.01); *G11C 7/1096* (2013.01); *G11C 7/22* (2013.01); *G11C 7/222* (2013.01); *G11C 11/4076* (2013.01); *G11C 11/4096* (2013.01); *H04L 67/00* (2013.01); *G11C 2207/2254* (2013.01)

(56) References Cited

U.S. PATENT DOCUMENTS

| | | | |
|---|---|---|---|
| 5,303,393 A | 4/1994 | Noreen et al. | |
| 5,438,355 A | 8/1995 | Palmer | |
| 5,444,769 A | 8/1995 | Koen et al. | |
| 5,539,635 A | 7/1996 | Larson, Jr. | |
| 5,548,828 A | 8/1996 | Kozaki et al. | |
| 5,557,541 A | 9/1996 | Schulhof et al. | |
| 5,579,537 A | 11/1996 | Takahisa | |
| 5,661,787 A | 8/1997 | Pocock | |
| 5,708,478 A | 1/1998 | Tognazzini | |
| 5,752,159 A | 5/1998 | Faust et al. | |
| 5,857,156 A | 1/1999 | Anderson | |
| 5,872,589 A | 2/1999 | Morales | |
| 5,903,617 A | 5/1999 | Kamalski | |
| 5,905,865 A | 5/1999 | Palmer et al. | |
| 5,907,793 A | 5/1999 | Reams | |
| 5,991,601 A | 11/1999 | Anderson | |
| 5,991,737 A | 11/1999 | Chen | |
| 6,035,177 A | 3/2000 | Moses et al. | |
| 6,036,086 A | 3/2000 | Sizer, II et al. | |
| 6,067,107 A | 5/2000 | Travaille | |
| 6,098,106 A | 8/2000 | Philyaw et al. | |
| 6,202,210 B1 | 3/2001 | Ludtke | |
| 6,286,140 B1 | 9/2001 | Ivanyi | |
| 6,446,262 B1 | 9/2002 | Malaure et al. | |
| 6,463,469 B1 | 10/2002 | Yavitz | |
| 6,473,792 B1 | 10/2002 | Yavitz et al. | |
| 6,507,727 B1 | 1/2003 | Henrick | |
| 6,578,047 B1 | 6/2003 | Deguchi | |
| 6,611,201 B1 | 8/2003 | Bishop et al. | |
| 6,658,232 B1 | 12/2003 | Johnson | |
| 6,701,355 B1 | 3/2004 | Brandt et al. | |
| 6,708,335 B1 | 3/2004 | Ozer et al. | |
| 6,725,022 B1 | 4/2004 | Clayton et al. | |
| 6,829,486 B2 | 12/2004 | McKenna et al. | |
| 6,888,457 B2 | 5/2005 | Wilkinson et al. | |
| 6,928,423 B1 | 8/2005 | Yamanaka | |
| 6,941,154 B1 | 9/2005 | Ritter | |
| 6,957,041 B2 | 10/2005 | Christensen et al. | |
| 6,970,886 B1 | 11/2005 | Conwell et al. | |
| 6,987,734 B2 | 1/2006 | Hundemer | |
| 6,990,312 B1 | 1/2006 | Gioscia et al. | |
| 7,010,667 B2 | 3/2006 | Vorbach et al. | |
| 7,054,653 B2 | 5/2006 | Järvi et al. | |
| 7,088,950 B2 | 8/2006 | Tassberg et al. | |
| 7,110,714 B1 | 9/2006 | Kay et al. | |
| 7,149,541 B2 | 12/2006 | Rautila | |
| 7,158,753 B2 | 1/2007 | Kagan et al. | |
| 7,190,971 B1 | 3/2007 | Kawamoto | |
| 7,194,235 B2 | 3/2007 | Nykanen et al. | |
| 7,260,842 B2 | 8/2007 | Hirayama | |
| 7,266,343 B1 | 9/2007 | Yli-juuti et al. | |
| 7,299,194 B1* | 11/2007 | Manganaris et al. | ........ 705/7.29 |
| 7,313,359 B2 | 12/2007 | Steelberg et al. | |
| 7,313,360 B2 | 12/2007 | Steelberg et al. | |
| 7,415,430 B2 | 8/2008 | Christensen et al. | |
| 7,415,526 B2 | 8/2008 | Hirayama | |
| 7,500,256 B1 | 3/2009 | Ohmae et al. | |
| 7,647,609 B2 | 1/2010 | Wachtfogel et al. | |
| 7,673,315 B1 | 3/2010 | Wong et al. | |
| 7,765,574 B1 | 7/2010 | Maybury et al. | |
| 7,773,939 B2 | 8/2010 | Christensen et al. | |
| 7,788,693 B2 | 8/2010 | Robbins | |
| 7,917,130 B1 | 3/2011 | Christensen et al. | |
| 8,166,081 B2 | 4/2012 | Christensen et al. | |
| 8,200,203 B1 | 6/2012 | Christensen et al. | |
| 8,467,724 B2 | 6/2013 | Christensen et al. | |
| 8,516,017 B2 | 8/2013 | Christensen et al. | |
| 8,589,548 B2 | 11/2013 | Karaoguz et al. | |
| 8,631,448 B2 | 1/2014 | Christensen et al. | |
| 8,635,302 B2 | 1/2014 | Christensen et al. | |
| 8,688,028 B2 | 4/2014 | Christensen et al. | |
| 2001/0031013 A1 | 10/2001 | Stetzler et al. | |
| 2002/0026474 A1 | 2/2002 | Wang et al. | |
| 2002/0046407 A1 | 4/2002 | Franco | |
| 2002/0133824 A1 | 9/2002 | Mensch | |
| 2002/0162118 A1 | 10/2002 | Levy et al. | |
| 2002/0178441 A1 | 11/2002 | Hashimoto | |
| 2003/0077065 A1 | 4/2003 | Scholten et al. | |
| 2003/0086694 A1 | 5/2003 | Davidsson | |
| 2003/0097338 A1 | 5/2003 | Mankovich et al. | |
| 2003/0105809 A1 | 6/2003 | Yoshii et al. | |
| 2003/0200543 A1 | 10/2003 | Burns | |
| 2003/0208756 A1 | 11/2003 | Macrae et al. | |
| 2004/0205810 A1 | 10/2004 | Matheny et al. | |
| 2004/0260682 A1 | 12/2004 | Herley et al. | |
| 2004/0268407 A1 | 12/2004 | Sparrell et al. | |
| 2005/0020223 A1 | 1/2005 | Ellis et al. | |
| 2005/0021744 A1 | 1/2005 | Haitsuka | |
| 2005/0071223 A1 | 3/2005 | Jain et al. | |
| 2006/0075426 A1 | 4/2006 | Koch et al. | |
| 2006/0117040 A1 | 6/2006 | Begeja et al. | |
| 2006/0174261 A1 | 8/2006 | Cline, Jr. et al. | |
| 2006/0184960 A1 | 8/2006 | Horton et al. | |
| 2006/0212921 A1 | 9/2006 | Carr | |
| 2007/0022437 A1 | 1/2007 | Gerken | |
| 2007/0088852 A1 | 4/2007 | Levkovitz | |
| 2007/0143777 A1 | 6/2007 | Wang | |
| 2007/0156457 A1 | 7/2007 | Brown | |
| 2007/0157257 A1 | 7/2007 | Kagan et al. | |
| 2007/0198353 A1 | 8/2007 | Behringer et al. | |
| 2007/0226146 A1 | 9/2007 | Ruul | |
| 2007/0287456 A1 | 12/2007 | Shimizu | |
| 2008/0049704 A1 | 2/2008 | Witteman et al. | |
| 2008/0065507 A1 | 3/2008 | Morrison et al. | |
| 2008/0086754 A1 | 4/2008 | Chen et al. | |
| 2008/0148320 A1 | 6/2008 | Howcroft | |
| 2008/0235746 A1 | 9/2008 | Peters et al. | |
| 2008/0263673 A1 | 10/2008 | Brun et al. | |
| 2009/0104870 A1 | 4/2009 | Christensen et al. | |
| 2009/0104872 A1 | 4/2009 | Christensen et al. | |
| 2009/0150925 A1 | 6/2009 | Henderson | |
| 2009/0177736 A1 | 7/2009 | Christensen et al. | |
| 2009/0192916 A1 | 7/2009 | Casper | |
| 2009/0205000 A1 | 8/2009 | Christensen et al. | |
| 2011/0179453 A1 | 7/2011 | Poniatowski | |
| 2013/0076493 A1 | 3/2013 | Christensen et al. | |
| 2014/0109152 A1 | 4/2014 | Christensen et al. | |
| 2014/0115105 A1 | 4/2014 | Christensen et al. | |

FOREIGN PATENT DOCUMENTS

| | | |
|---|---|---|
| DE | 196 27 308 A1 | 1/1998 |
| EP | 0 713 335 A2 | 5/1996 |
| EP | 1 742 397 A2 | 1/2007 |
| GB | 2346472 | 8/2000 |
| HK | 1150692 | 1/2012 |
| JP | 07-500715 | 1/1995 |
| JP | 08-139624 | 5/1996 |
| JP | 09-162818 | 6/1997 |
| JP | 09-163346 | 6/1997 |
| JP | 10-135855 | 5/1998 |
| JP | 10-163988 | 6/1998 |
| JP | 10-177532 | 6/1998 |
| JP | 10-257401 | 9/1998 |
| JP | 10-257455 | 9/1998 |
| JP | 2000-115093 | 4/2000 |
| JP | 2000-115094 | 4/2000 |

(56) References Cited

FOREIGN PATENT DOCUMENTS

| | | |
|---|---|---|
| JP | 2000-183835 | 6/2000 |
| JP | 2000-196547 | 7/2000 |
| JP | 2000-236306 | 8/2000 |
| JP | 2000292182 A | 10/2000 |
| JP | 2002-504775 | 2/2002 |
| KR | 10-1996-0033096 | 9/1996 |
| KR | 10-1998-0078248 | 11/1998 |
| WO | PCT/US89/02927 | 7/1989 |
| WO | WO 90/00847 | 1/1990 |
| WO | PCT/GB92/000181 | 1/1992 |
| WO | WO 92/14222 | 8/1992 |
| WO | PCT/GB93/01526 | 7/1993 |
| WO | WO 94/02909 | 2/1994 |
| WO | PCT/CA96/00794 | 12/1996 |
| WO | PCT/FI97/00315 | 5/1997 |
| WO | PCT/US97/07485 | 5/1997 |
| WO | WO/97/21291 | 6/1997 |
| WO | WO 97/42724 | 11/1997 |
| WO | WO 97/45814 | 12/1997 |
| WO | PCT/US98/00040 | 1/1998 |
| WO | PCT/US98/20725 | 10/1998 |
| WO | PCT/CH99/000006 | 1/1999 |
| WO | PCT/GB99/00514 | 2/1999 |
| WO | WO 99/18518 | 4/1999 |
| WO | WO 99/35771 | 7/1999 |
| WO | WO 99/35809 | 7/1999 |
| WO | WO 99/43109 | 8/1999 |
| WO | WO 00/19662 | 4/2000 |
| WO | PCT/US00/17157 | 6/2000 |
| WO | WO 00/78050 | 12/2000 |
| WO | PCT/US01/02781 | 1/2001 |
| WO | WO 01/01331 | 1/2001 |
| WO | WO 01/22633 | 3/2001 |
| WO | PCT/US01/11184 | 4/2001 |
| WO | WO 01/52541 | 7/2001 |
| WO | WO 01/57759 | 8/2001 |
| WO | PCT/US01/28831 | 9/2001 |
| WO | WO 01/77779 | 10/2001 |
| WO | WO 02/23773 | 2/2002 |
| WO | WO 2006/122028 | 11/2006 |
| WO | WO 2008/002000 | 1/2008 |

OTHER PUBLICATIONS

"Sirius to Add 'Instant Buy' Button", Mar. 13, 2000, Twice, V 15, n 7, p. 28.
International Search Report and Written Opinion for Application No. PCT/US2009/033249 mailed Jun. 23, 2009.
Jan. 25, 2000, Showcase 2000—Xenote Press Release re Xenote iTage, www.xenote.com/html/press/releases.html.

* cited by examiner

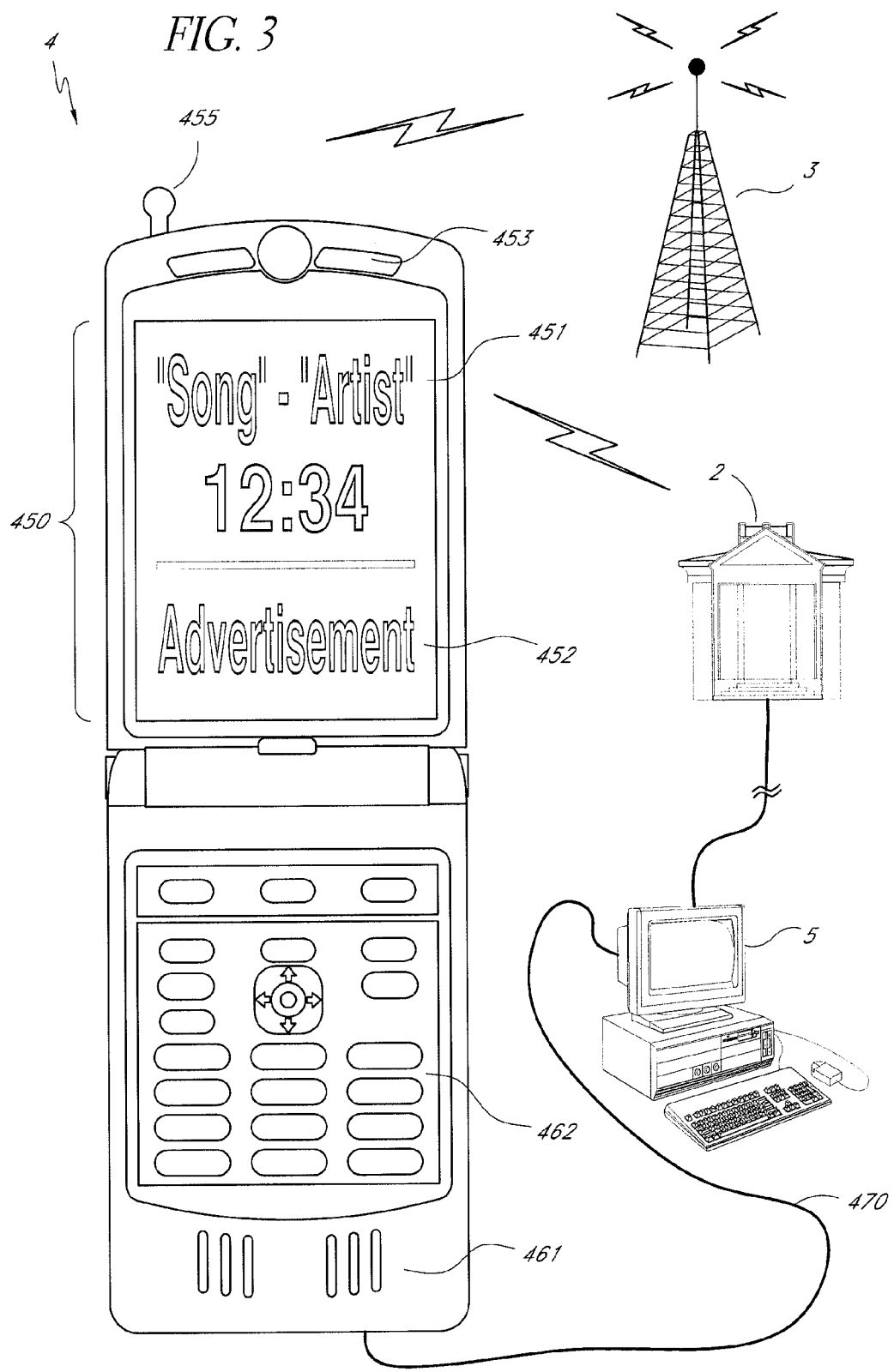

*FIG. 8*

Add a Campaign | Campaigns | Clients | Ad Graphics | My Profile | Log Out
Welcome Back, Customer

[Campaigns]                                          << Back to Campaigns

☑ Step 1         ☑ Step 2              ☐ Step 3       ☐ Step 4          ☐ Step 5
*Choose a Client*  *Campaign Information*  *Demographics*  *Select Stations*  *Review and Launch*

Step 2: Campaign Information

*Campaign Details* ?

- Client Name: Digital Muse
- *Campaign Name: [Advertisement Entity]
- *Campaign Types:
  - Click Throughs ($0.12 per 100 clicks)
  - Interstitial ($10.00 per 1000 views)
  - More Info ($0.50 per click)
  - On Air Ad ($0.12 per 100 clicks)
  - Primary Banner ($10.00 per 1000 views)
  - Qualified Lead ($50.00 per lead)
  - Splash Screen ($25.00 per 1000 views)
- Notes: [ ]

*Schedule* ?

- *Begins: [02/04/2009 (Wed)]  Ends: [-- ONGOING --]
- Between the hours of: [--24/7--]  and: [--24/7--]
- Advertise Now! ☐ ?
- Handset Calendar Scheduling ☐ ?

*Generic Ad Details* ?

Showing Generic Version

◁ [92.9 MHz  3] ▷
MENU    GET    BACK

* Provide Ad Short Text (Preview)
[ ]

* Provide Ad Text (Preview)
[ ]

*Ad Response Details* ?

- Bar Code ASCII (Code 39) [Project]
- Handset Response URL [http://]
- Web Response URL [http://]

⇦ PREV          Step 2: Campaign Information          NEXT ⇨

SYSTEM AND METHOD FOR ADVERTISEMENT TRANSMISSION AND DISPLAY

CROSS-REFERENCE TO RELATED APPLICATIONS

This application is a continuation of application Ser. No. 13/452,783, entitled "System and Method for Advertisement Transmission and Display," filed Apr. 20, 2012, which is a continuation of application Ser. No. 12/366,535, entitled "System and Method for Advertisement Transmission and Display," filed Feb. 5, 2009, which claims the benefit of U.S. Provisional Application No. 61/026,449, filed Feb. 5, 2008, the entire contents of which are hereby incorporated herein by reference, including specifically but not limited to the systems and methods relating to advertisement transmission and display.

BACKGROUND

1. Field

The invention relates generally to media advertising and in particular to systems and methods for associating an advertising media signal with another media signal.

2. Description of the Related Art

In advertising, it is generally desirable to associate products with specific characteristics, such as associating a brand of car with quality engineering. Another example is associating a brand of beverage with the characteristic of happiness or lifestyle as exhibited by smiling people. Creating such associations in the minds of potential customers may generally increase the chance that a potential customer will choose to purchase a product that is associated with a favorable characteristic. Celebrities and other images often exhibit favorable characteristics. Therefore, an advertisement may be more effective if the product advertisement is associated with an image of a celebrity or other media element exhibiting favorable characteristics.

SUMMARY

In certain embodiments, a method for associating multiple media signals, comprising in no particular order: obtaining information about a first media signal; analyzing the information about the first media signal; selecting at least one second media signal to be correlated with the first media signal based on at least one criteria; assigning a unique identifier that is specific to the transmission of the selected second media signal, wherein at least the unique identifier is stored in a database; transmitting at least the second media signal and the unique identifier to a user device, wherein the user device outputs the first media signal and the second media signal to a user; receiving a user response from the user in relation to the second media signal wherein the user response includes at least the unique identifier; and correlating at least the unique identifier in the database.

In some embodiments, a method for combining multiple media signals in a device, comprising in no particular order: obtaining a first media signal by the device; outputting a first media content comprised in the first media signal to a user of the device; obtaining a second media signal by the device; obtaining a criteria correlated to the second media signal; evaluating the criteria in reference to the user of the device; and outputting at least a second media content comprised in the second media signal to the user of the device, wherein in the second media content outputted is determined at least in part based on the evaluation of the criteria.

In certain embodiments, a user device system capable of combining multiple media signals comprising: a first receiver module configured to receive at least a first media signal from a first transmitter; a second receiver module configured to receive at least a second media signal and a unique identifier correlated to the second media signal; an output module configured to output a primary media content from the first media signal and output a secondary media content from the second media signal; an input module capable of receiving at least a user input; and a transmitting module capable of transmitting at least the user input and the unique identifier to a computer server, wherein the computer server has access to a database containing at least the unique identifier.

In some embodiments, a method for associating multiple media signals, comprising in no particular order: obtaining information about a first media signal; analyzing the information about the first media signal; selecting at least one second media signal to be correlated with the first media signal based on at least one criteria; assigning a unique identifier that is specific to the transmission of the selected second media signal, wherein at least the unique identifier is stored in a database; transmitting at least the second media signal and the unique identifier to a user device, wherein the user device outputs the first media signal and the second media signal to a user; and transmitting the unique identifier to a third party.

For purposes of this summary, certain aspects, advantages, and novel features of the invention are described herein. It is to be understood that not necessarily all such advantages may be achieved in accordance with any particular embodiment of the invention. Thus, for example, those skilled in the art will recognize that the invention may be embodied or carried out in a manner that achieves one advantage or group of advantages as taught herein without necessarily achieving other advantages as may be taught or suggested herein.

BRIEF DESCRIPTION OF THE DRAWINGS

The foregoing and other features, aspects and advantages of the present invention are described in detail below with reference to the drawings of various embodiments, which are intended to illustrate and not to limit the invention. The drawings comprise the following figures in which:

FIG. 3 illustrates one embodiment of a user device with a user interface, connected to a media association system.

FIG. 8 illustrates one embodiment of a conditional access portal for establishing operations criteria, filters and conditions for the control, transmission, presentation, response to and reporting of media content activity.

DETAILED DESCRIPTION

Figure 1:
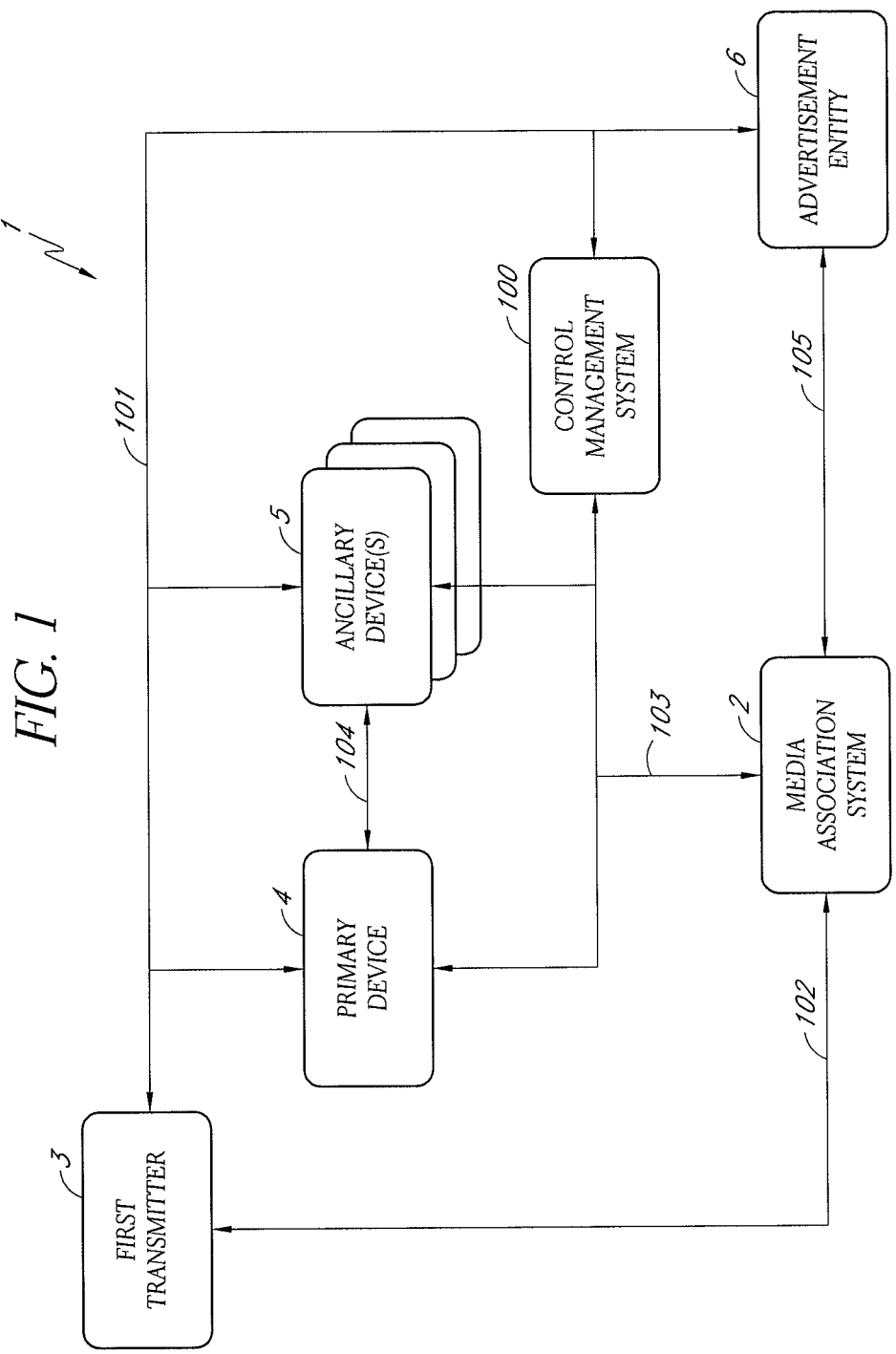
FIG. 1 illustrates a high-level overview of one embodiment of a media enhancement system.

The disclosure herein provides systems and methods for a media enhancement system configured to associate a secondary media signal (for example, the secondary media signal can comprise an advertisement) to a primary media signal (for example, a radio broadcast). The disclosure herein additionally provides systems and methods for a media enhancement system that enables the generating, transmitting, displaying, and/or responding to a plurality of associated and/or unassociated secondary media signals, based on a primary media content from a primary media signal, user characteristics (for example, demographic and/or geographic information), and/or third-party preferences (for example, the goals of advertisers). The secondary media signals can be used to enhance the primary media content already being provided to the user on a user device. The secondary media signals can also be used to create psychological associations or relationships with the primary media content already being provided to the user.

For example, in one embodiment, a radio station transmits a song that is received by a user enabled-device, such as a cellular phone with a radio. The transmitted song is transmitted in a first media signal. The song is analyzed by a media association system to determine what prospective media elements can be associated with the song. The user enabled-device obtains and/or receives from the media association system a secondary media signal that is separate and/or discrete from the first media signal. For example, the secondary media signal could be an advertisement for a particular truck. As the user enabled-device is playing a song obtained from the first media signal, the user enabled-device displays the media content in the second media signal, wherein the media content can be a still or moving picture of the advertised truck. In another embodiment, as the user enabled-device is playing a song obtained from the first media signal, the user enabled-device displays the media content obtained from the second media signal, wherein the media content can be a still or moving picture with user selectable audio of the advertised truck wherein the first audio track could be paused upon selection.

Additional information could be associated with the first media signal and/or the secondary media signal. For example, additional information could be obtained by the user enabled-device in the form of a text message that offers a test drive of the advertised truck at a local truck dealer. A third media signal could be obtained or received by the user enable-device providing the address information and/or direction to the nearest truck dealer based on the GPS location of the user enabled-device. As an alternative to GPS, triangulation or other similar method may also be used to locate the user-enabled device. Accordingly, one or more media signals can be associated with the first media signal.

In one embodiment, the system provides logic and/or a user interface to allow users to select the form of desired media. For example, the user can select to receive textual, graphical, and/or audio media content based on the user's location. For example, if the user is in an environment that is not conducive to generating audio, such as in some transit systems, libraries, and/or schools, then the system could generate graphical and/or textual media content, and no audio media content.

In another embodiment, the first media signal provides and/or sends programming and/or other media content, the second media signal provides and/or sends additional information about the programming from a source other than the originator of the first media signal, and/or the third media signal (from a third party source) could provide and/or send unique media content to be associated with the first media signal and/or the second media signal. For example, a radio broadcast is received as the first media signal by a user device comprising an analog or digital receiver. The user device also receives the second media signal through for example, GPRS, EVDO and/or HSDPA over a wireless network, wherein the second media signal comprises additional information about the broadcast, such as an artist name, a title, an advertisement, an advertiser, a purchase option, a voting option, and/or other interactive options available and/or related to the first media signal. The user device also receives the third media signal comprising comments sourced through a peer to peer relationship received from other user devices relaying comments, opinions, and/or other additional information about the first and/or second media signals.

In one embodiment, the system comprises a computational device that receives a streamed internet transmission sourced from a radio station, a radio receiver that receives the first media stream from the radio station, a user device such as a cell phone capable of presenting to the user a media stream, and/or a storage device that could be connected via a network to at least a computational device and/or the user device/cell phone. The storage device is configured to present the multiple media streams that are available. The computational device is configured to perform an analysis of the first media stream. Based on user selectable criteria, the computational device is configured to select from the storage device which available media stream is to be associated with the first media stream. The storage device is configured to use the network connection to send the selected additional media stream to the cell phone.

The cell phone is configured to display the additional media stream. When the user changes the radio status (for example, changes station and/or turns off the device), the additional media stream on the cell phone could be continued, the user or device could alert the computational device of the status change to be used in future analysis, and/or the radio could automatically communicate with the computational device regarding the changed status. The computational device is configured to continuously monitor and/or detect changes in the media streams from the radio station (for example, one song followed by another song) via the internet streaming of the radio station transmission.

In one embodiment, the first media signal and the advertisement message could be integrated into the same transmission. The media association system could associate the first media signal with the advertisement message before the broadcast of the first media signal is completed. In another embodiment, the first media signal and the advertisement message are separate and discrete. In another embodiment, the first media signal is intercepted before reaching the user device and the advertisement message is added to the first media signal and sent on to the user device. In all three of the above embodiments, where the first media signal and advertisement message are discrete, integrated or combined after interception, the device receives both the first media signal and the advertisement message and presents them to the user.

In one embodiment, the first media signal and the second media signal are integrated into the same transmission. In one embodiment, the first media signal and the second media signal are separate and discrete. In one embodiment, the first media signal is intercepted before reaching the user device and the second media signal is added to the first media signal and sent on to the user device. In one embodiment, the user can respond to the second media signal. In one embodiment, the user response is to the first media signal sender. In one embodiment, the user response is to the second media signal sender. In one embodiment, the user response is to a third party. In one embodiment, the media content of the second media signal is selected based on demographic information of the user, status of the user device (such as make, model, geographic location and/or other pertinent information) and/or other like criteria. In one embodiment, the second media signal is transmitted to the user device prior to the transmission of the first media signal. In one embodiment, the media content of the second media signal is stored in the user device. In one embodiment, the stored media content of the second media signal is communicated to the user based on a media association system integrated into the user device. In one embodiment, a third signal is sent to the user device indicating which, if any, stored media content should be communicated to the user.

As used herein, the terms "media" or "media content" are broad terms that comprise any form of content, including without limitation, graphics, videos, sounds, text, text messages, interactive applications, vibrations, television and/or radio programming, podcasts, movies, songs, games, telephone conversations, speeches, news, information, advertisements, polls votes, personal messages, and/or other physical manifestations capable of communicating a concept or idea.

Similarly, the terms "hear," "view," "read," "feel," "sense," their synonyms, and their alternative conjugations should be used interchangeably when referring to any form of media. When one sensory verb is used in connection with one form of media, it will be clear that other forms of media could be used in conjunction with other sensory verbs (such as "hear a sound" is interchangeable with "view a graphic"). Similarly, the terms "display," "present," their synonyms, and their alternative conjugations should be used interchangeably and be broadly interpreted as providing media to be sensed by the user.

The terms "media signal," "broadcast stream," or "media stream" are broad terms that comprise broadcasts or transmissions from AM/FM radio, Digital radio, IBOC, Satellite, Cable, Analog television, Digital Television, HSDPA (3G), UMTS, CDMA, internet, WiFi, other broadcast stations/entities, and/or other media conveyance methodologies such as direct wire connections. Media signals can be unique media streams. Further, the foregoing terms also comprise data signals or data streams from servers or devices that stream data and/or media to other devices or servers. For example, a radio device can receive a first media signal comprising music media content being played by a radio station, and the radio device can also receive simultaneously, serially, or otherwise a second media signal comprising an advertisement sent by an advertisement server or media association system.

Further, the term "program" is a broad term that comprises a portion of a media signal in any media form, or combinations thereof. This can comprise for example a discrete song, a series of songs, a truncated song, a song followed by or preceded by commentary, a song accompanied with graphical images and/or video, a song accompanied by text, combinations thereof, and/or analogous portions of other forms of media. Other examples can include, but are not limited to: discrete media elements comprising video and/or audio, a series of media elements, a portion of a media element, a media element followed by, or preceded by commentary, a media element accompanied with fixed graphical images, video, and/or audio, a media element accompanied by text, combinations thereof, and/or analogous portions of other forms of media.

Further, the term "sensor" is a broad term that comprises any mechanism for converting an external stimulus and/or characteristic into a simplified signal, comprising buttons, keyboards, joysticks, touch-screens, thermometers, electrocardiographs, cameras and other photo sensors, microphones, a mouse, trackpad and/or trackball, mice, styluses, GPS systems, and/or other sensors. These sensors can output to electromagnetic signals, optical displays, audio outputs, vibrators, signal carried by wire, and/or any other externally detectable response.

Further, the term "communication methods" as used herein broadly refers to protocols, standards, conventions, and/or the like for communicating. This comprises hypertext transfer protocol ("HTTP"), file transfer protocol ("FTP"), amplitude/frequency modulation ("AM/FM"), general packet radio service ("GPRS"), evolution-date optimized ("EVDO"), short message service ("SMS"), radio broadcast data system ("RBDS"), Bluetooth®, digital radio mondiale ("DRM"), in band on channel ("IBOC"), high speed download packet access ("3G" and/or "HSDPA"), other forms of broadcast, telephony, peer-to-peer networking/protocol, and/or the like. Additionally, "communication methods" could comprise various physical means for conveying information comprising nonexclusively electromagnetic waves (for example, radio or light), sound waves, cables, and/or the like. "Communication methods" also comprises indirect methods, such as a first communication to an intermediary via HTTP, followed by a communication from the intermediary to a receiver by a television signal. It should be understood that specific communication methods could be interchangeable in the context of this disclosure.

Further, the term "communications element" as used herein broadly refers to devices, elements, machines, and/or structures capable of using communication methods. Examples comprise radio transmitters, receivers, transceivers, cellular phones, internet-capable computers, Ethernet cards, wireless adapters, and/or the like.

Further, the term "broadcast" as used herein broadly refers to media distributed publicly over a communication method, comprising without limitation terrestrial radio, over-the-air (or terrestrial) television, cable, satellite, internet downloading, WIFI, internet streaming, other communications by electro-magnetic waves, and/or the like.

Further, in general the word "module," as used herein, refers to logic embodied in hardware and/or firmware, and/or to a collection of software instructions, possibly having entry and/or exit points, written in a programming language, such as, for example, Java, and/or the Java Platform-Micro Edition (Java ME, and/or J2ME), comprising the Java Specification Request 234 (JSR 234) Advanced Multimedia Supplements. Other programming languages comprise without limitation COBOL, CICS, Lua, C and/or C++ and an application program including pseudo code interpretable instructions. A software module may be compiled and linked into an executable program, installed in a dynamic link library, and/or may be written in an interpreted programming language such as, for example, BASIC, Perl, PHP and/or Python. It will be appreciated that software modules may be callable from other modules and/or from themselves, and/or may be invoked in response to detected events and/or interrupts. Software instructions may be embedded in firmware, such as an erasable programmable read-only memory (EPROM). It will be further appreciated that hardware modules may be comprised of connected logic units, such as gates and/or flip-flops, and/or may be comprised of programmable units, such as programmable gate arrays and/or processors. The modules described herein are preferably implemented as software modules, but may be represented in hardware and/or firmware. Generally, the modules described herein refer to logical modules that may be combined with other modules or divided into sub-modules despite their physical organization or storage.

The terms "computer," "computer server," "computing system," "computer clients," "servers," or "computing system devices" as used herein are interchangeable terms, and the terms broadly refer, without limitation, to a machine that manipulates data according to a list of instructions or the like.

Further, the terms "response transmission," "responses," "click-throughs," or "status report" are broad terms that include any of the communication means described above to transfer information from the device to other components of the system such as the media association system, first transmitter, message entity, control monitoring system, ancillary device or other primary devices. The information can include, but is not limited to, aspects of the device such as being turned off, being turned on, accessing a different media signal; status of reception of a first media signal, an advertising signal, an associated media signal, a related media signal and/or an identifier (a unique identifier, content, device, user, advertising signal, first media signal, broadcaster, message entity and/or identifying other aspects of the system); device capabilities, including but not limited to parameters associated with first media signal, advertisement signal, associated media signal, and/or related media signal presentation (display, audio, vibration), user input capabilities, communication capabilities; device status such as location, motion, use patterns, capabilities being utilized, ambient environment; and/or user status.

The terms "rules," "criteria," "conditional filters," "programmable filters," "filters," "association criteria," "logic and rules of operation," or "advertisement criteria" are broad terms that comprise without limitation determinate control over the following: access, creation, organization, communication, presentation and display to users, dissemination, pricing, device and signal availability, user device media signal presentation and correlation to programming and/or programmable filters, and/or conditions to be applied to the media signals.

The terms "unique event identifier," or "unique identifier" as used herein are broad terms that refer to any means for identifying a specific instance of a broadcast stream, transmission and/or media signal. As used herein, when the terms "unique identifier" or "unique event identifier" are used in specificity it is to establish preeminence of operation amongst identifiers. It is not intended to limit or exclude the presence or use of other identifier elements, content and/or classes. The term "identifier" or "identifies" as used herein are a broad terms that refer to a representation of that which is being identified. The identifier may include, but is not limited to, at least the unique identifier and may further comprise identification of other elements, contents and/or classes. Such elements may comprise: an advertisement, related media, associated media, device, language user of a device, and/or first media signals. Such contents may comprise: a first media signal, related media, associated media, device, language, user of a device, and/or first media signal. And/or such classes may comprise: a class of a first media signal, advertisement, related media, associated media, device, language, user of a device, and/or first media signal. The unique event identifier and/or identifiers are preferably implemented as a part of a database that allows for the storage and/or retrieval of the identifier and/or data associated with the identifier. By means of the unique event identifier and/or identifiers, reports can be generated on the performance of various aspects of the system such as who, what, when, where, why, which, and/or how an event within the system occurred, including the number of times an event within the system occurred; locations for events; what prompted an event; devices, signals and/or users associated with events and/or means associated with the events.

Media Enhancement System

FIG. 1 depicts one embodiment of a media enhancement system for transmitting and/or displaying advertisements and/or other media content, wherein the system comprises but is not limited to a first transmitter 3, control management system 100, a media association system 2, a primary device 4, an ancillary device(s) 5, and an advertisement entity 6.

Figure 1A:
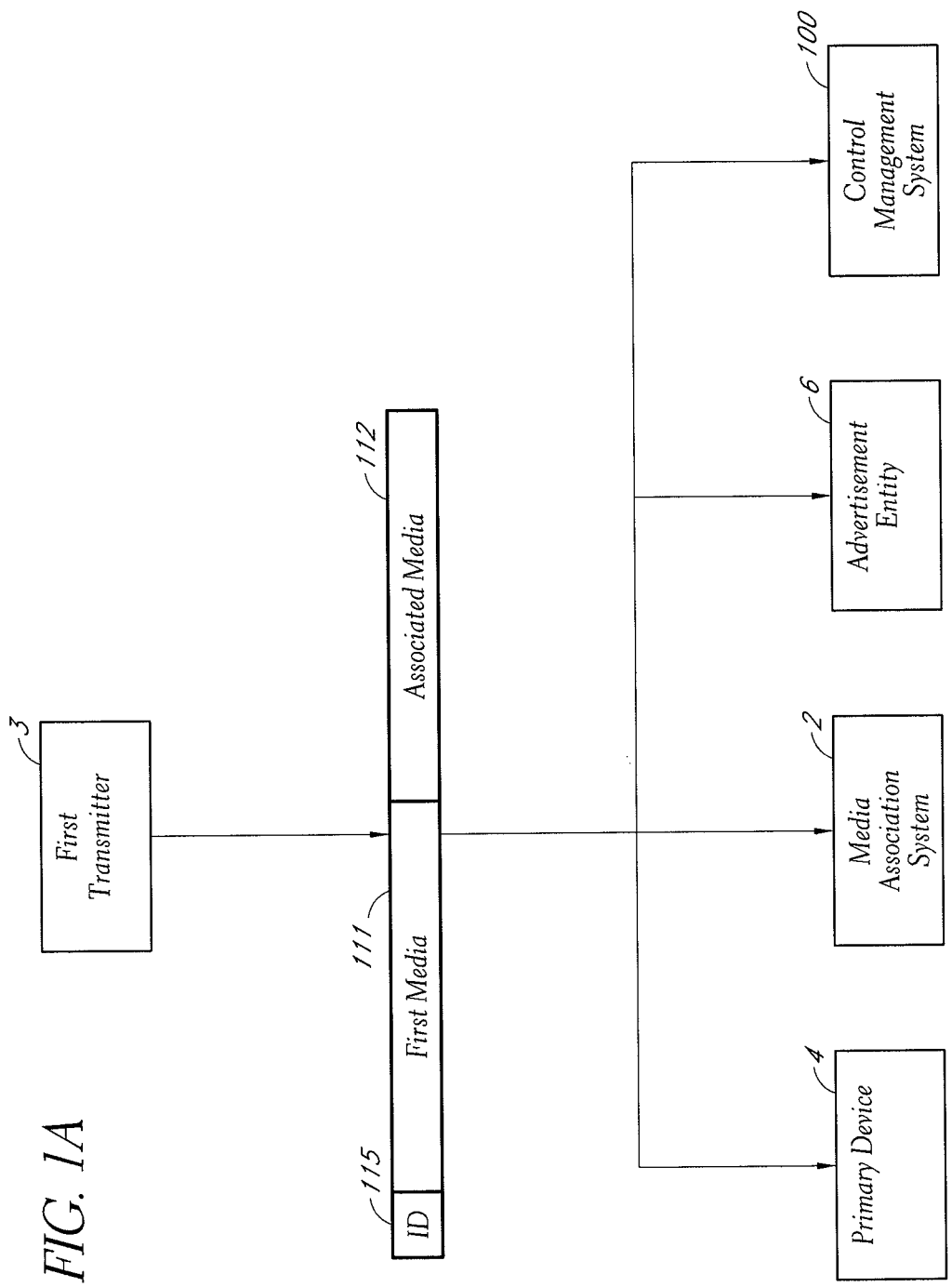
FIGS. 1A-1C illustrate signals and identifiers correlated and transmitted in between elements of one embodiment of a media enhancement system.

Referring to FIG. 1, the first transmitter 3 can be a radio station broadcasting through an antenna tower via modulated electromagnetic waves. In other embodiments, the first transmitter 3 comprises but is not limited to a broadcaster broadcasting content over the internet (for example, by UDP, TCP/IP, HTML, HTTP, and/or the like), a broadcaster broadcasting content through a cable line, satellite and/or through other communication methods. Additionally, the first transmitter 3 can comprise a computer connected to the internet so as to transmit information to a more limited set of receivers, such as to a set of internet protocol addresses email addresses, instant messenger accounts, and/or the like. Thus, as further examples the first transmitter 3 can comprise an instance of peer-to-peer software, an interactive web-based video game, a website with controlled access, and/or the like. The first transmitter 3 can also comprise a telephone and/or wireless connection, so as to transmit information by phone, cellular phone, and/or other wired or wireless communication. The first transmitter 3 can also comprise a connection to some other element, such as a serial connection, capable of any form of communication method. Additionally, the first transmitter 3 can comprise an encryption module to limit access to a first media signal 111, as illustrated in FIG. 1A. Generally, the first transmitter 3 comprises a communications element. By an indirect or direct communication method, the first transmitter 3 sends a first media signal 111 that is received by the primary device 4.

The primary device 4 illustrated in FIG. 1 may be a portable device, such as a radio, television, digital media player, GPS unit, multi purpose displays, cellular phone, laptop computer, personal digital assistant, transceiver, transmitter, receiver, and/or the like. The primary device 4 may also be a non-portable device, such as a desktop computer, television, landline telephone, and/or the like. The primary device 4 can display the media content in the first media signal 111 and/or transmit the first media signal to one or more ancillary devices 5, which may take the form of any device such as those defined for primary device 4 or an adjunct to a primary device 4 such as a personal computer, server, digital media player docking station, video player, printer, clock, telephone, answering machine, recorder, remote control and/or the like. The ancillary device can be portable, mobile such as a radio in a car or fixed in place. The ancillary devices 5 can then display the media content in the first media signal 111 and/or transmit the first media signal back to the primary device 4. When the ancillary device 5 comprises a communications element capable of retransmitting the first media signal 111, the first media signal may be viewed on the primary device 4 at a later time without requiring data storage on the primary device 4. When the ancillary device 5 comprises a communications element capable of retransmitting the first media signal 111, the first media signal and/or information identifying the first media signal 111, may be viewed on the ancillary device 5 at a later time without requiring data storage on the primary device 4. The first media signal 111 that is transmitted from the first transmitter 3 to the primary device 4 can contain any form(s) of media in digital and/or analog formats.

Also illustrated in FIG. 1, the primary and/or ancillary devices 4, 5 can transmit information back to the first transmitter 3 by either the same communication method or by a different communication method. For example, the first media signal 111 sent by the first transmitter 3 can comprise a talk radio program soliciting responses to a poll. The primary and/or ancillary devices 4, 5, can respond by, for example, placing a phone call to the first transmitter 3, when either the primary or ancillary device is capable of telephony. Alternatively, the first transmitter 3 can comprise a computer connected to the internet, sending a first media signal 111 instant message advertising an upcoming pay-per-view television program. The primary device 4 may comprise a computer configured to receive this instant message and upon receiving a user response transmit the message to an ancillary device 5. The ancillary device 5 can comprise a television with interactive capabilities, such that upon receiving the message from the primary device 4 the ancillary device 5 can request the pay-per-view television program from the first transmitter 3. The first transmitter 3 can then send the television program directly to the ancillary device 5. It will be clear that other communication methods between the first transmitter 3 and the primary and/or ancillary devices 4, 5 are possible.

Figure 1B:
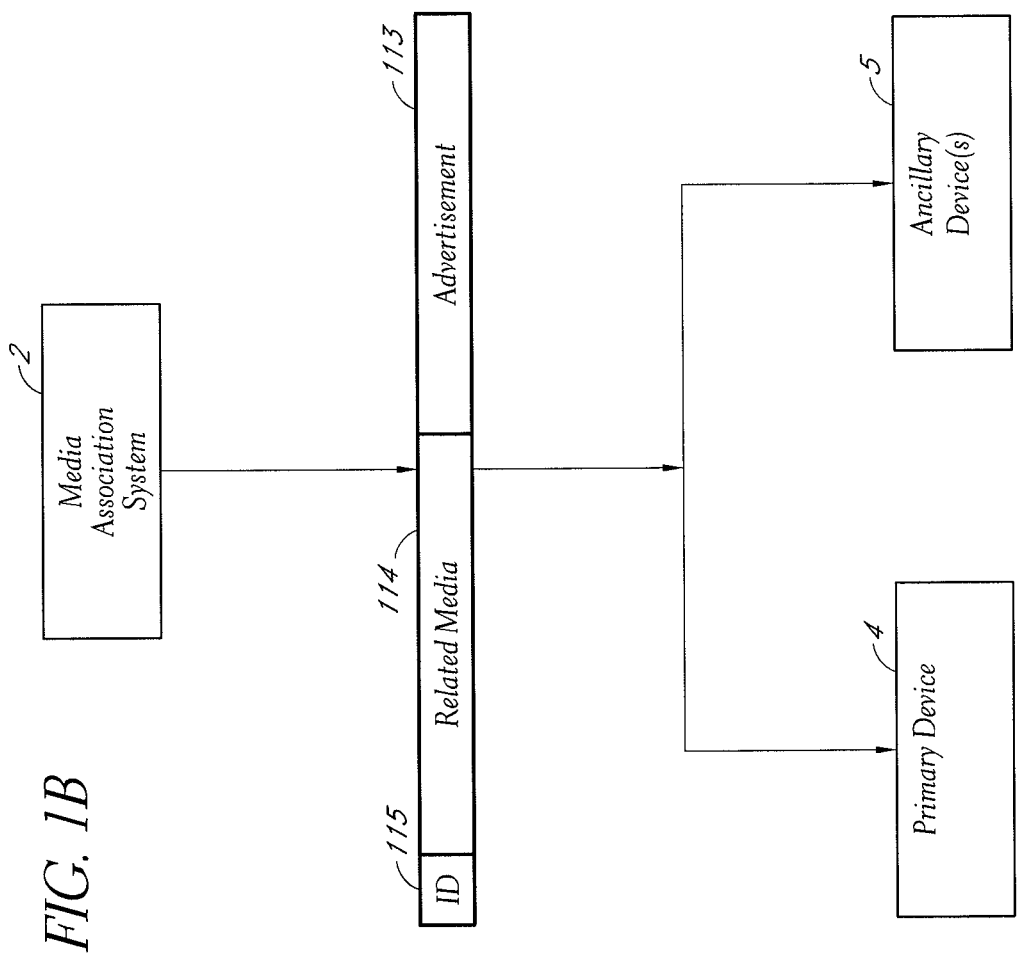

Referring to FIG. 1, similar transmissions and/or interactions can be made between the first transmitter 3 and the media association system 2 and/or the advertisement entity 6. The media association system 2 and the advertisement entity 6 can each comprise the same forms as those identified for the primary and/or ancillary devices 4, 5 and/or the first transmitter 3. In one embodiment, the media association system 2 may comprise a radio signal receiver connected to a computer that is connected to the internet. The media association system 2 can then receive and/or identify the media content in the first media signal 111. For example, the media association system 2 can identify the media content as a particular song or particular program. As illustrated in FIG. 1B, media association system 2 can use this information to send or transmit a secondary or related media signal 114, such as information regarding the media content of the first media signal 111, to the primary device 4 and/or the ancillary devices 5 through an internet connection. The secondary or related media signal 114 can be provided by any communication method described herein, and the secondary or related media signal 114 can either be the same or different type of communication method used to transmit the first media signal 111.

In one embodiment, as illustrated in FIG. 1, the first transmitter 3 and the media association system 2 can be combined into a single system with one part performing the functions of the first transmitter 3 and another part performing the functions of the media association system 2. The communications, processing, memory, and/or other components of such a combined system can be shared between the different parts or be separate.

As illustrated in FIG. 1, the primary device 4 and/or ancillary device 5 can also send signals back to the media association system 2 and/or to the control management system 100. For example, if the related media signal 114 sent by the media association system 2 to the devices 4, 5 comprises purchasing information for a song present in the first media signal 111, the primary and/or ancillary devices 4, 5 can provide a purchase request to the media association system 2. The media association system 2 can then transmit the purchase request to the first transmitter 3, to a third party for fulfillment, and/or to the control management system 100. The response transmission sent back to the media association system 2 and/or the control management system 100 can comprise: the response to a first media signal 111 and/or a unique identifier 115 obtained from first media signal 111, a response to an advertisement media signal 113, and/or a unique identifier 115 obtained from advertisement media signal 113, (and/or a user identifier, a device identifier etc), a user selection from a list of options and/or the status of the device (including but not limited to the presentation of the first media signal, presentation of the advertisement signal, changing which first transmitter 3 is being received, the device turning on or off).

Referring to FIG. 1, the advertisement entity 6 can make similar communications with the primary and/or ancillary devices 4, 5, the first transmitter 3, as well as the media association system 2, to a third party for more information, and/or to the control management system 100. For example, the advertisement entity 6 can send an advertisement signal 113 to the media association system 2, for the purpose of having it provided by the media association system 2 to the primary and/or ancillary devices 4, 5. The advertisement entity 6 can also send advertisement criteria to the media association system 2, such that the advertisement signal 113 is provided to the primary and/or ancillary devices 4, 5 upon them receiving a specific song from the first transmitter 3 in the first media signal 111. The advertisement signal 113 can comprise, for example, graphical media along with an interactive purchasing option for the advertisement entity's product. A user of the primary and/or ancillary devices 4, 5 can respond to the advertisement signal 113 with a purchase order in the form of an interactive response sent back to the media association system 2, to a third party for fulfillment/more information or the control management system 100, and/or directly to the advertisement entity 6.

As illustrated in FIG. 1, the advertisement entity 6 can also communicate with the first transmitter 3, to a third party for fulfillment/more information. and/or the control management system 100. As illustrated in FIG. 1A, for example, the first transmitter 3 can send to the advertisement entity 6 a current and/or future schedule of the media content to be contained in the first media signal 111. As illustrated in FIG. 1B the advertisement entity 6 can then use this information to determine the advertisement media content 113 it transmits to the media association system 2. In another embodiment, as illustrated in FIG. 1A, the first transmitter 3 can send to the control management system 100 a current and/or future schedule of the media content to be contained in the first media signal 111. As illustrated in FIG. 1B, the control management system 100 can then use this information to determine the advertisement media content 113 it transmits to the media association system 2.

The First Media Signal

Referring to FIG. 1A, the first transmitter 3 can send a first media signal 111 to the primary device 4 and/or ancillary device 5. FIG. 1A also illustrates an embodiment of a first media signal 111 transmitted from the first transmitter 3 to the primary device 4, the media association system 2, and the advertisement entity 6. The first media signal 111 can comprise any type of media as set forth herein.

In some embodiments the first media signal 111 can be integrated or transmitted together with a secondary or associated media signal 112 and/or identifier 115 (as illustrated in FIG. 1A) or the first media signal 111 can be transmitted separately from the associated media signal 112 and/or identifier 115. The associated media signal 112 can comprise information and/or data related to or about the media contents in the first media signal 111, such as the title, author, artist, album, ad, advertiser, length, date of creation, language identifier, checksum, error checking/correction and/or other relevant information, or the associated media signal 112 can comprise associated media content, such as album cover art, accompanying music, lyrics and/or other media content. When the associated media signal 112 is integral with the first media signal 111 the two signals can be combined into a single signal transmitted with, for example, alternating information or data packets (as illustrated in FIG. 1A) over a single frequency or physical data connection.

The associated media signal 112 can be transmitted integrally with the first media signal 111 via a communication method. Alternatively, when the two signals are separate they can be transmitted on distinct frequencies, through distinct physical connections, at distinct times, and/or through distinct communication methods (for example, one by physical connection and the other by electromagnetic waves). Integrally combining a first media signal 111 with an associated media signal 112 can ensure that all, substantially all, or some of devices that receive the first media signal 111 can also receive the associated media signal 112. In some cases, when the first media signal 111 and the associated media signal 112 are not integral or are sent as separate media signals, then a unique identifier 115 can be assigned to the first media signal 111 and/or the associated media signal 112. In other embodiments, the identifier is not a unique identifier. In some embodiments, the unique identifier 115 is specific to the transmission of the first media signal 111 and/or the associated media signal 112. In another embodiment, the unique identifier 115 is tied to the specific instance of each media content segment conveyed via the first media signal 111. In another embodiment, the unique identifier 115 is tied to the specific instance of each media content segment conveyed via the associated media signal 112.

Figure 1C:
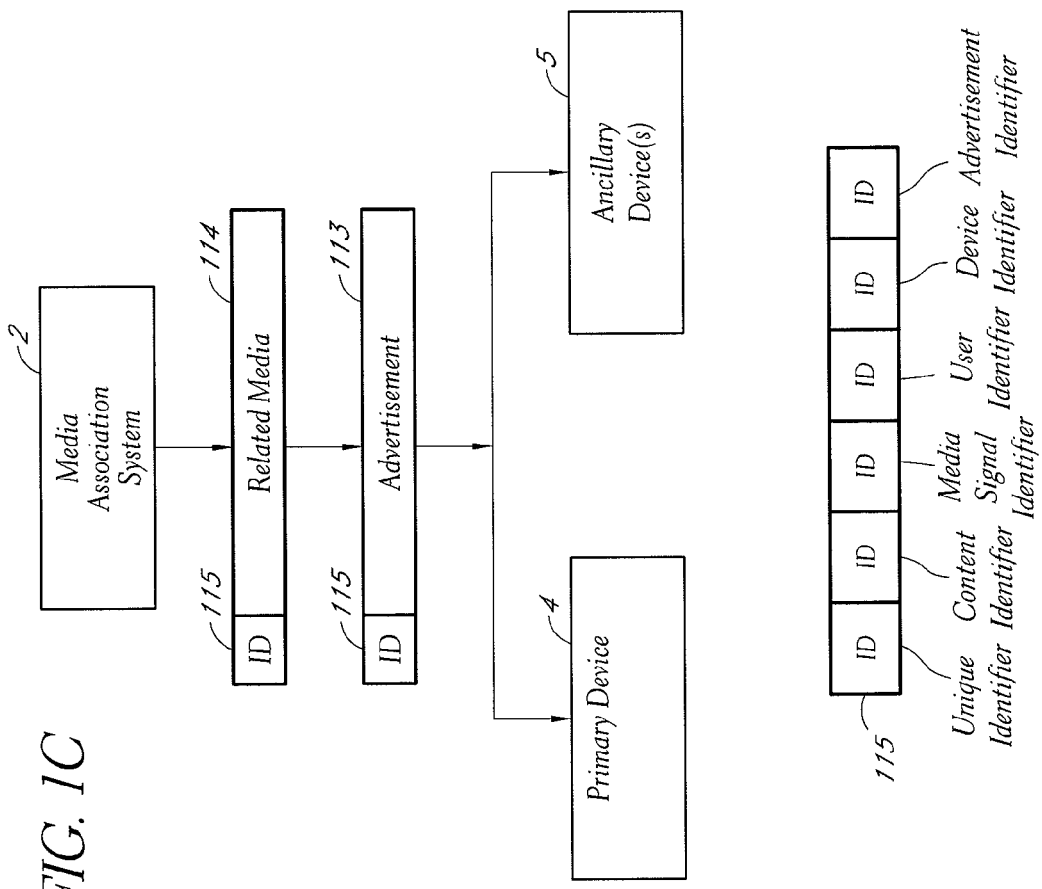
Figure 1D:
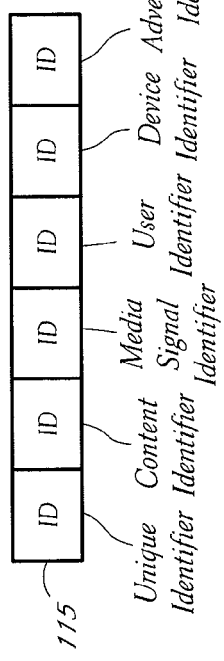
FIG. 1D illustrates identifiers correlated, transmitted and stored in a database in relation to elements of one embodiment of a media enhancement system.

As illustrated in FIG. 1D, the unique identifier 115 is database-linked thereby allowing a user (for example, a user of the control management system 100, media association system 2 and/or advertisement entity 6) to conduct a search or lookup of the information identified by the unique identifier 115 to determine the location, the user device, the time of transmittal, the program and/or media content in the first media signal, the available options for response to the user of the device, and/or other identifying characteristic information. Identifiers illustrated in FIG. 1D are representative but not limited to identifiers, elements, content and/or classes of identifiers used in the media enhancement system. As depicted in FIG. 8, the control management system 100 can comprise a conditional access user interface that allows programmable filters and/or conditions to be applied to the control, transmission, presentation and/or response to media content. The frequency of media content presentation, the duration of media content presentation, cost of click through responses to third parties by end users using primary device 4 and/or ancillary device 5, cost or pricing for use of the media association system 2, the conditions of response to media content presentation, the defined parameters controlling the relationship between first media signal 111 and associated media signal 112 and the language relating to the media content is controlled by conditions set in the control management system 100.

Conditional filters established and/or controlled in the control management system server 100 may include but not be limited to: geographic location, time of day, language, source of broadcast transmission, account establishment for participation by third parties, cost of click throughs, cost of media content presentation, cost of reporting frequency of media content presentation, number of times media content presentation occurred, responses generated from media content presentation, demographic information associated with media content presentation and response, reporting results of media content presentation and response, noticeability of messages and/or advertisements by the user, demographic of the user, frequency of presentation, duration of presentation, size of the graphic and/or video presented, compression of the audio presented, combinations of the same, or the like. In addition, logic and rules of operation for presentation can be maintained by the control management system 100. Conditional filters established and/or controlled in the control management system server 100 can also modulate and/or determine features of the primary device 4, features of the ancillary device 5 and/or availability of communication means.

As illustrated in FIG. 1A, an identifier 115 can also be used when the first media signal 111 and associated media signal 112 are integral. The identifier 115 can serve to identify both signals, or only one of these signals and/or media content segments within a signal.

Again referring to FIGS. 1, 1A the first media signal 111 from the first transmitter 3 can come in the form of an electromagnetic wave (for example, traditional radio, digital radio and/or television signals, WiFi, satellite, cellular phone signals, and/or the like), electronic and/or fiber-optic transmission over cable lines (such as, land-line telephones, cable television, DSL, other internet connections, and/or the like), and/or other communication methods.

Although the first media signal 111, as depicted in FIG. 1A, is transmitted to the primary device 4, the media association system 2, and the advertisement entity 6, it is clear that the first media signal 111 could further be transmitted to any number of devices or entities, as well as the ancillary devices 5 including the control management system 100.

The Advertisement Signal

Referring back to FIG. 1, both the media association system 2 and the advertisement entity 6 can provide an advertisement media signal 113 to the primary and/or ancillary devices 4, 5. The advertisement media signal 113 can be provided by any of the communication methods disclosed herein, and/or can comprise any form of media content.

FIG. 1B and FIG. 1C illustrate the media association system 2 transmitting the advertisement media signal 113 and the related media signal 114 to the primary and/or ancillary devices 4, 5. Similar to the first media signal 111, the related media signal 114 and/or the advertisement media signal 113 can comprise graphics, video, audio, and/or text. Additionally, similar to the first media signal 111, the related media signal 114 and/or the advertisement media signal 113 can be interactive in nature, allowing back-and-forth communication between the primary device 4 and the media association system 2, the advertisement entity 6 and the control management system 100. For example, the advertisement media signal 113 may comprise games, polls or votes, message boards, discounts, digital coupons, premiums, options to purchase related products, and/or other interactive activities. Further, the first media signal 111 can also be associated with a plurality of advertisement media signals 113 to be selectively played throughout the duration of the first media signal 111.

Along with the advertisement media signal 113, the advertisement entity 6 in FIG. 1 can provide advertisement criteria, associated with said advertisement signal 113, for determining when said advertisement signal 113 should be provided to the primary and/or ancillary devices 4, 5 and/or conditions of presentation to a user. To facilitate the assignment and/or sending of an advertisement media signal 113 with a first media signal 111, a unique identifier 115 can be provided to each media signal (the first media signal 111, the advertisement media signal 113, and/or the related media signal 114), and/or each instance of each signal or content media segment. Similarly, media signals can additionally or alternatively be assigned one or more non-unique identifiers 115 to classify said media signals for similar purposes, such as an identifier for all, substantially all, or some instances of advertisement media signals 113 with a given graphical image, all, substantially all, or some signals provided in a given time period, all, substantially all, or some signals provided to a given device, all, substantially all, or some signals originating from a given source, or other purpose. These identifiers 115 can be stored in a database and/or other location such as the control management system 100, along with other relevant information. The unique identifier 115 can be used by the media association system 2, the advertisement entity 6, the first transmitter 3, and/or the primary and/or ancillary devices 4, 5 and/or the control management system 100 as discussed further below, to track and/or record the results of any given signal as well as to determine whether the signal should be provided to the primary and/or ancillary devices 4, 5 and/or the user. Presentation of advertisement signal 113 on primary devices 4 and/or ancillary devices 5 may be different for each user even when receiving the same first media signal 111 depending on the age, gender, language, location, time of day, type of device, user preferences, user affiliations, combinations of the same, or the like as defined by criteria established in the control management system 100, the media association system 2 and/or the advertisement entity 6.

Again referring to FIG. 1B, the advertisement media signal 113 transmitted by the advertisement entity 6 can contain a unique and/or non-unique identifier 115, along with further associated data integrated with the signal. For example, the advertisements media signal 113 may be immediately preceded by or immediately follow a data signal with the advertisement signal's unique identifier 115, identifiers 115, and/or advertisement criteria. The advertisement media signal 113 may also be associated with a separate data signal also sent by the advertisement entity 6, for example, in a simultaneous transmission or in a later transmission. The signals can be associated by their time of transmission, use of identifiers 115, or any other characteristics.

The identifier 115 associated with the first media signal 111, associated media 112, advertisement signal 113, and/or related media 114, could each be separate and/or discrete from each other. The identifier 115 associated with the first media signal 111, associated media 112, advertisement signal 113, and/or related media 114, could be the same identifier.

In one embodiment, the advertisement media signal 113 can be conveyed to the primary device 4 and/or ancillary device 5 prior to transmission of the first media signal 111. Along with the advertisement signal 113, the identifier 115 can contain association criteria for the advertisement signal 113. The primary device 4 and/or the ancillary device 5 can store the advertisement signal 113 and the identifier 115. Examples of such association criteria include, but is not limited to, the ability to recognize a particular first media signal by its identifier 115, demographic information the advertisement signal 113 is appropriate for, information to match the demographics of the advertisement signal 113 with a first media signal 111, and/or similar information. When a first media signal 111 and identifier 115 is received by the primary device 4 and/or the ancillary device 5, then the association criteria could be applied. For example, an advertisement signal 113 identified as appropriate for people over 40 years of age could be indicated by the identifier 115, could have been received earlier and stored in the primary device 4 and/or ancillary device 5. A first media signal 111 could be received by the primary device 4 and/or ancillary device 5, along with the identifier 115 indicating the first media signal 111 is directed primarily at people over 40. The association criteria could check the storage on primary device 4 and/or ancillary device 5, determine that advertisement signal 113 is appropriate for presentation with first media signal 111 and then have either the primary device 4 and/or ancillary device 5 to present the advertisement signal 113 at the same time or substantially the same time as the first media signal 111 is presented to the user of the primary device 4 and/or ancillary device 5. In some embodiments, the advertisement signal 113 may be presented at a different time than the first media signal 111. Similarly, in another embodiment the advertisement signal 113 and a corollary identifier 115 are associated with a first media signal 111. The first media signal 111 and the corollary identifier 115 are received and stored by the primary device 4 and/or ancillary device 5. When the primary device 4 and/or ancillary device 5 receives the first media signal 111 with the first media identifier 115 corollary to the advertisement signal identifier 115, the association criteria would check the stored information on primary device 4 and/or ancillary device 5 to determine that advertisement signal 113 is appropriate for presentation with first media signal 111. Validation is confirmed because the advertisement signal identifier 115 and first media identifier 115 correlate. Next, the primary device 4 and/or ancillary device 5 present the advertisement signal media signal 113 at the same time or nearly the same time as the first media signal 111 is presented to the user of primary device 4 and/or ancillary device 5.

The methods and systems of user sign up and/or opt in to web based portals for the purpose of managing content selection, advertising response follow up and/or account management are further described in detail in U.S. patent application Ser. No. 10/806,084, filed Mar. 22, 2004, titled "BROADCAST RESPONSE METHOD AND SYSTEM," which is incorporated by reference in its entirety.

Related Media Signal

As illustrated in FIGS. 1, 1A, 1B, 1C, the media association system 2 can also provide media as a service to the user and/or for its own benefit. The related media signal 114 sent from the media association system 2 to the primary device 4 and/or ancillary devices 5 can comprise any form of media content which may or may not be related to the first media signal 111 and/or the advertisement media signal 113. For example, the related media signal 114 may comprise album art and/or a music video relating to a first media signal 111 that comprises a song. Additionally, the related media signal 114 can comprise text, such as a song's author, title, album, producer, lyrics, music notation, purchasing information, and/or other information. It will be clear that the related media signal 114 can also comprise interactive media, advertisements and/or any other form of media. It will also be clear that the related media signal 114 may be related to other criteria, such as criteria related to the user. For example, the related media signal 114 can comprise a reminder pre-programmed by the user, and/or other reminders such as a reminder to pay a service bill. Thus, the related media signal 114 can be related to the first media signal, the user, the media association system 2, the advertisement signal 113, and/or any other relevant element.

Again referring to FIGS. 1, 1B, 1C, the related media signal 114 can be provided from the media association system 2 by any communication method discussed herein. This may be the same means or a different means from that which is used to transmit the advertisement media signal 113 and/or the first media signal 111. Additionally, like the foregoing media signals, the related media signal 114 may also be associated with a unique or non-unique identifier 115.

As illustrated in FIGS. 1B, 1C the advertisement signal 113 and the related media signal 114 can be sent integrally or separately, as can the first media signal 111 and associated media signal 112.

Response Signals

As illustrated in FIG. 1, the primary and/or ancillary devices 4, 5 can also send signals to the first transmitter 3, the media association system 2, control management system 100 and/or the advertisement entity 6. As discussed above, these signals from the primary and/or ancillary devices 4, 5 can comprise responses to interactive media signals. Additionally, the primary and/or ancillary devices 4, 5 can also transmit user data in response to or independent of signals received by the primary and/or ancillary devices 4, 5. The primary device 4 can transmit user behavior, such as when the user changes a channel, turns the device on or off, changes the volume, and/or any other parameter. Primary and/or ancillary devices 4, 5 equipped with GPS systems and/or other geographical positioning systems, such as those offered by Google®, can also report location, direction of motion, and/or speed. Primary and/or ancillary devices 4, 5 further equipped with other sensors can detect other information or data about the user and/or the user's location and/or environment. Such information can advantageously be used by the media association system 2 to decide what media and/or advertisements to be sent to the primary and/or ancillary devices 4, 5 in order to obtain a reaction from the user in general, and/or what media and/or advertisements are likely to elicit a positive reaction at a given time and/or when the user is in a given state or environment, as further discussed below.

Additionally, as depicted in FIG. 1, the ancillary devices 5 can convey data from the primary device 4 to the media association system 2. For example, if the primary device 4 is a radio-enabled cellular phone and an ancillary device 5 is a personal computer, the primary device 4 can collect data and later upload that data to the personal computer through a data transfer protocol, such as Bluetooth®, which in turn can send the user data through a network connection to the media association system 2. The ancillary device 5 can comprise superior bandwidth, storage capacity, and/or processing power relative to the primary device 4, allowing the ancillary device 5 to transmit more complex data to the media association system 2.

As further illustrated in FIG. 1, the primary and/or ancillary devices 4, 5 can also provide similar communications with the advertisement entity 6 and/or the first transmitter 3, and/or the control management system 100 as disclosed for the media association system 2. Thus, the primary and/or ancillary devices 4, 5 can be equipped to receive multiple media signals from either of these sources, and respond thereto in the same way as done with the media association system 2. It is additionally possible for the primary and/or ancillary devices 4, 5 to communicate with any of the other entities indirectly through the media association system 2.

The methods and systems of processing responses or broadcast responses are further described in detail in U.S. patent application Ser. No. 10/806,084, filed Mar. 22, 2004, titled "BROADCAST RESPONSE METHOD AND SYSTEM," which is incorporated by reference in its entirety.

Referring to FIG. 1, it is clear that system 1 could encompass multiple first transmitters 3, primary devices 4, ancillary devices 5, media association systems 2 and/or message entities 6. The introduction of multiple components in system 1 can increase the versatility of the communication connections. As an example, when primary device 4 is receiving a first media signal 111 from a first transmitter 3, then the advertisement signal 113 can be handled using the media association system 2. But when the primary device 4 changes device status to receive a different first media signal 111 from a different first transmitter 3, then advertisement signal 113 may need to switch and be obtained from a different media association system 2. This switch can occur in several different ways depending on how the communications are conducted. As an example, the change from first transmitter 3 to the different first transmitter 3 can be a change in tuning frequency, change in the method of communication with first transmitter 3, sending a message to first transmitter 3 and/or the different first transmitter 3 and/or other action. With the change from first transmitter 3 to the different first transmitter 3, the primary device 4 and/or ancillary device 5 can have already stored and/or obtained data indicating which media association system 2 corresponds to the different first transmitter 3 and how to establish communication with the appropriate media association system 2. Alternatively, the associated media 112 can indicate which media association system 2 will have the advertisement signal 113 for the primary device 4 and/or ancillary device 5. Alternatively, the media association system 2 can have a gateway system associated with it such that all communication from the primary device 4 and/or ancillary device 5 can be sent through the gateway. Then the media association system 2 can have sub-modules associated with the different first transmitters 3. When the primary device 4 and/or ancillary device 5 indicates a device status change, the appropriate media association system 2 sub-modules can be informed so they can stop sending advertisement signal 113 associated with the current first transmitter 3 and begin sending advertisement signal 113 associated with the different first transmitter 3. Alternatively, when the current media association system 2 receives the device status change from primary device 4 and/or ancillary device 5 indicating a change from receiving the current first transmitter 3 to receiving the different first transmitter 3, then current media association system 2 can inform the different media association system 2 of the change, stop sending advertisement signal 113 to primary device 4 and/or ancillary device 5, and the different media association system 2 can begin sending advertisement signal 113 to primary device 4 and/or ancillary device 5. Alternatively, primary device 4 and/or ancillary device 5 can communicate with the control management system 100 all device status changes such as device turning on or off, device changing stations and/or the like. The control management system 100 could then coordinate among the media association systems 2 for which of them will communicate with the primary device 4 and/or ancillary device 5. Alternatively, the primary device 4 and/or ancillary device 5 can send devise status change information to some or all media association systems 2 allowing them to determine which one of them should communicate with primary device 4 and/or ancillary device 5.

Primary Device
Computing System Components

Figure 2:
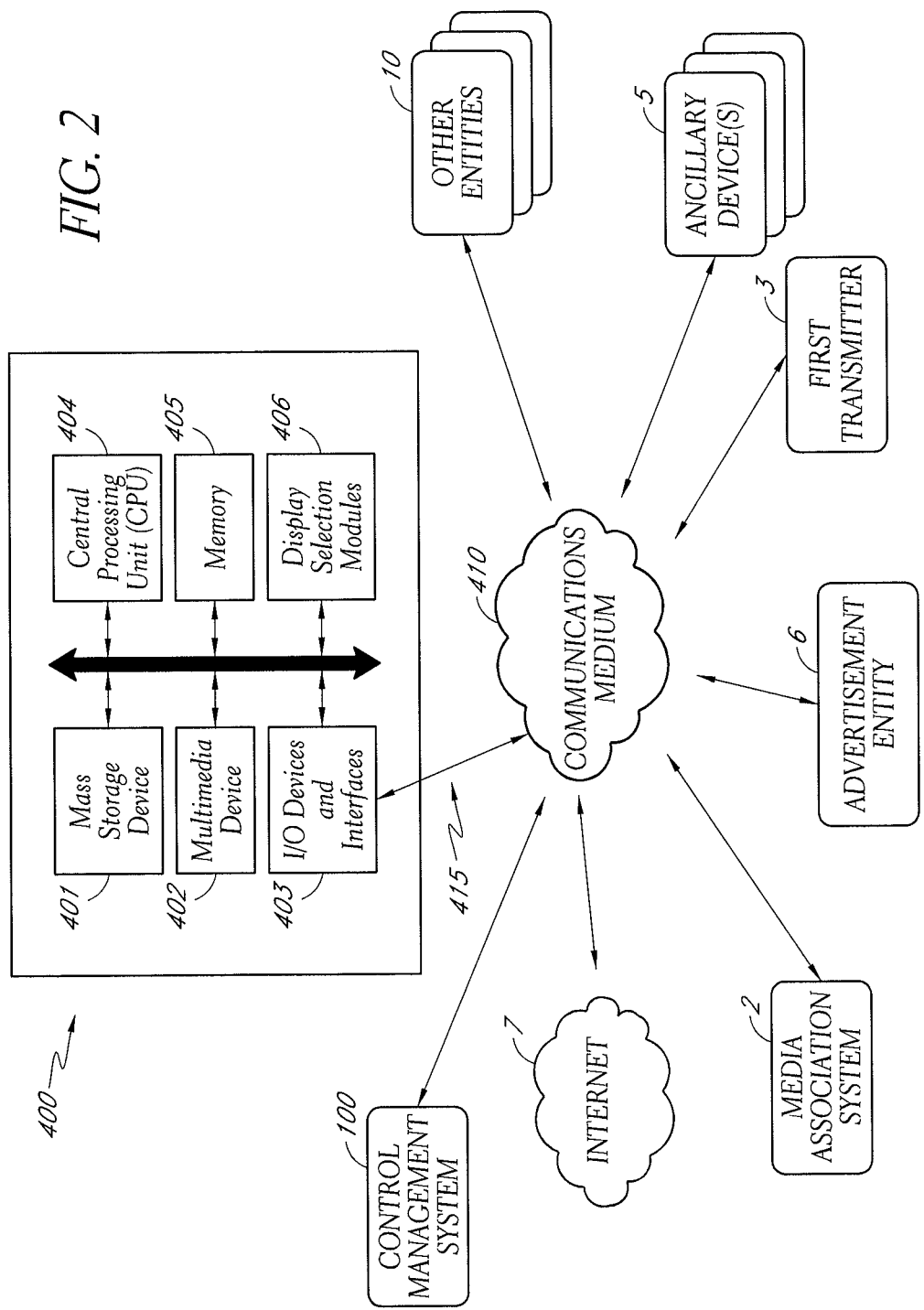
FIG. 2 illustrates a block diagram of one embodiment of a user device connected to a media association system via a network.

FIG. 2 illustrates an embodiment of a primary device 4. The primary device 4 comprises a computing system 400, which comprises a computer system suitable for controlling and/or communicating with the media association system 2, the advertisement entity 6, the first transmitter 3, the control management system 100 and other third parties for which the primary device 4 is designed to communicate (for example, the internet 7). The components and/or connections disclosed below for computing system 400 can also be used to implement the other modules, systems, and/or devices described herein.

The computing system 400 comprises a central processing unit (CPU) 404, which may comprise a microprocessor and/or baseband chip. The computing system 400 further comprises a memory 405, such as random access memory (RAM) for temporary storage of information and/or a read only memory (ROM) for permanent storage of information, and a mass storage device 401, such as a hard drive, diskette, flash memory, and/or optical media storage device. Typically, the modules of the computing system 400 are connected to the computer system 400 using a standards based bus system. In other embodiments, the standards based bus system could be Peripheral Component Interconnect (PCI), Microchannel, SCSI, Industrial Standard Architecture (ISA), Baseband Bus and Extended ISA (EISA) architectures, and/or other proprietary bus system for example.

In one embodiment, the computing system 400 comprises one or more commonly available input/output (I/O) devices and/or interfaces 403, such as a keyboard, mouse, touchpad, four-way navigation button, other sensors, wireless technologies such as Bluetooth, WiFi, Infrared, and/or a printer. In one embodiment, the I/O devices and/or interfaces 403 comprise one or more display devices, such as a monitor or display that allows the visual presentation of media and/or options to a user. More particularly, a display device provides for the presentation of GUIs, application software data, multimedia presentations, menus and/or any other form of media or decision lists. In the embodiment of FIG. 2, the I/O devices and/or interfaces 403 also provide a communications interface to various external devices. The computing system 400 may also comprise one or more multimedia devices 402, such as speakers, video cards, graphics accelerators, microphones, vibrators, and/or other devices capable of presenting media.

Computing System Device/Operating System

The computing system 400 may operate on a variety of computing devices, such as, for example, a server, a Windows server, a Mac server, a Structure Query Language server, a Unix server, Linux server, a personal computer, a mainframe computer, a laptop computer, a cell phone, a personal digital assistant, a kiosk, an audio player, combinations of the same, or the like. The computing system 400 is generally controlled and coordinated by operating system software, such as z/OS, Windows 95, Windows 98, Windows NT, Windows 2000, Windows XP, Windows Vista, Linux, Unix, SunOS, Solaris, Palm, Windows Mobile, Symbian, Blackberry, Android, Mac OS X and/or the like. Other operating systems may also be compatible. In other embodiments, the computing system 400 may be controlled by a proprietary operating system. Operating systems control and schedule computer processes for execution, perform memory management, provide file system, networking, and I/O services, and/or provide a user interface, such as a graphical user interface (GUI), among other things.

Network

In the embodiment of FIG. 2, the computing system 400 communicates with a network 410, such as one or more of a LAN, WAN, cellular network, public switched telephone network, and/or the Internet, for example, via a wired, wireless, or combination of wired and wireless, communication link 415. The network 410 communicates with various computing devices and/or other electronic devices via wired and/or wireless communication links. In the embodiment of FIG. 2, the network 410 is communicating with the media association system 2, the advertisement entity 6, the first transmitter 3, the internet 7, the ancillary devices 5, and/or other entities 10 with which any of the preceding elements are configured to communicate.

Access to the display selection module 406 of the computer system 400 by the media association system 2 may be through a web-enabled user access point such as a computer, cellular phone, laptop, and/or other device capable of connecting to the network 410. Such a device may have a browser module implemented as a module that uses text, graphics, audio, video, and/or other media to present data and to allow interaction with data via the network 410. The browser module may be implemented as a combination of an all, substantially all, or some points addressable display such as a cathode-ray tube (CRT), a liquid crystal display (LCD), organic light emitting diode (OLED), a rear-projection display, a plasma display, or other types and/or combinations of output devices to present media to the user. In addition, the browser module may be implemented to communicate with input devices 403 and may also comprise software with the appropriate interfaces which allow a user to access data through the use of stylized screen elements such as, for example, menus, windows, dialog boxes, toolbars, and/or controls (for example, radio buttons, check boxes, sliding scales, combinations of the same, or the like). Furthermore, the browser module may communicate with a set of input and/or output devices to receive signals from the user. The input device(s) may be connected and designed to interpret outputs from sensors comprised on the primary device 4. The output device(s) may comprise a speaker, a display screen, a printer, and/or a voice synthesizer. In addition a touch screen may act as a hybrid input/output device. In another embodiment, a user may interact with the system more directly such as through a system terminal connected to the primary device 4 without communications over the Internet, a WAN, LAN, and/or similar network capable of a communication method.

Other Systems

In addition to the systems that are illustrated in FIG. 2, the network 410 may communicate with other data sources and/or other computing devices. The computing system 400 may also comprise one or more internal and/or external media sources. For example, any of the media provided by the sources described herein may be stored in whole or in part in the computing system 400 or may be stored in whole or in part on ancillary devices 5 or the media association system 2. In some embodiments, one or more of the data repositories and/or the data sources may be implemented using a relational database, such as DB2, Sybase, Oracle, CodeBase, mySQL, PHP and/or Microsoft® SQL Server as well as other types of databases such as, for example, a flat file database, an entity-relationship database, object-oriented database, and/or a record-based database.

It will be clear that any ancillary devices 5 can comprise the same organizational structure as the primary device 4, as described in this section.

User Interface

FIG. 3 illustrates a user interface of an embodiment of a primary device 4. When primary device 4 receives the first media signal 111 through a receiver 455 and/or wire data connection 470, the contents of first media signal 111 can be presented along with related information to the user on primary device 4. For example, if the first media signal 111 comprises a radio program the primary device 4 can play the audio signal to the user through speaker 453. In some embodiments, the primary device 4 can modify the program by changing the volume and/or pitch, overlaying other audio effects, pausing and resuming the program, and/or if the program has been recorded the primary device 4 can fast-forward or skip through the program. Analogous effects could be made on a television signal, comprising overlaying related content in a discrete section of the screen or mixing distinct audio signals with distinct video signals. It will be clear that further modifications could be made by the primary device 4 prior to viewing by the user for other forms of media. It will also be clear that the modifications need not be limited by the form of media viewed. Thus, for example, some embodiments can add graphics to a purely audio media signal, or add audio to a purely graphical media signal.

More specifically, the embodiment of a primary device presented in FIG. 3 is a radio-enabled cellular phone with a display panel 450. When tuned to a radio station the first transmitter 3, the display panel 450 can show information relating to the radio program being played, and the information can be acquired from an associated media signal 112 and/or from the media association system 2. In FIG. 3, the upper portion of the display panel 451 can comprise textual information corresponding to the music being played on the radio, comprising the name of the artist, title of the song or media content, and/or time remaining in the song or media content. However, the display could also comprise other information comprising the record label or logo, the price of the album or media content, related news, lyrics, radio station logo, advertiser logo or message, and/or sponsored information or other information that users may desire to see while listening to the radio station. Additionally, the display can comprise album art, a music video, and/or any other form of media (graphical, textual and/or otherwise). In this embodiment, the information is provided in an upper panel 451 but it could also be provided in other portions of the display panel 450. It will additionally be clear that this information need not be static, but can instead scroll across the screen, periodically rotate through a set of distinct images and/or messages, and/or comprise other visual effects. It will further be clear that the images on the upper panel 451 could be associated with other media provided along with the radio signal, such as a brief ping and/or vibration when a new image is presented. Control and/or presentation logic of the graphic and/or audio information presented via display panel 450, upper panel 451, lower panel 452, and/or speaker 453 is established and maintained through the use criteria established in the control management system 100 and/or rules of operation established in the media association system 2.

The lower panel 452 of the display panel in FIG. 3 displays an advertisement signal 113. In the illustrated embodiment, the lower panel 452 displays a textual advertisement signal 113. However, like the related media signal 114 displayed on the upper panel 451, the advertisement signal 113 can comprise any sort of media which can be provided as a static image, scrolling images, text, overlaid audio, interactive media, video, and/or other forms of media. Notably, the advertisement signal 113 need not be presented through the display panel, but could alternatively be presented through the speaker, a vibration system, and/or any other primary device output 402, 403.

In other embodiments, it will be advantageous to provide the related media signal 114 and the advertisement signal 113 to the display panel 450 separately as in FIG. 3, or to provide the related media signal 114 in a distinct display panels 450, or to alternate what is displayed, such that only one signal or media content segment is displayed in the display panel 450 at any one time. For example, the display panel 450 can comprise two separate panels, one for presenting the related media signal 114 and the other for presenting the advertisement signal 113. This may be advantageous for allowing viewers to quickly and more easily identify the information they wish to find. In other embodiments, one signal is brighter than another or one display should be turned off while the other remains on. Considering these alternative embodiments, it will also be clear that the primary device 4 need not display both an advertisement signal 113 and a related media signal 114 at the same time. As an example, the primary device 4 may provide a related media signal 114 or provide an advertisement signal 113. As another example, the primary device 4 may provide a toggle button 462 allowing a user to toggle between displays of the advertisement signal 113 and the related media signal 114. It may be advantageous to set the display panel 450 to show the advertisement signal 113 by default, and then to display the data signal upon activation of the toggle button 462. The display panel 450 can then return to displaying the advertisement signal 113 upon the occurrence of some criteria such as a re-activation of the toggle button 462 or the passage of a certain amount of idle time. In another embodiment, advertisement signal 113 may be presented using display panel 450, upper panel 451 or lower panel 452 depending on various pricing scenarios determining value of the presentation area based on criteria such as: noticeability of the message or presentation by the user, age or gender of the user, frequency of presentation, duration of presentation, size of the graphic or video presented, compression of the audio presented, combinations of the same, or the like. Logic and rules of operation for presentation can be established through use of a conditional access portal in the control management system 100 or media association system 2 or a logical operative of both. Presentation of advertisement signal 113 on primary devices 4 and/or ancillary devices 5 may be unique for each user even when receiving the same first media signal 111 depending on criteria such as: age, gender, language, location, time of day, type of device, user preferences, user affiliations, combinations of the same, or the like.

Referring further to FIG. 3, in some embodiments, the related media signal 114 and/or the advertisement signal 113 may be provided using the same display means as the first media signal 111. In FIG. 3, the first media signal 111 may comprise audio along with video and/or graphical media content. In this instance the display panel 450 can be further subdivided, such that the primary device 4 can present each graphical signal (first media signal 111, advertisement signal 113, and/or related media signals 114) all, substantially all, or some on the same display panel 450. In other embodiments, the primary device 4 can be configured by the user or through the media association system 2 to adopt a set of display criteria, which instructs the computing system 400 what should be displayed and how.

Figure 3A:
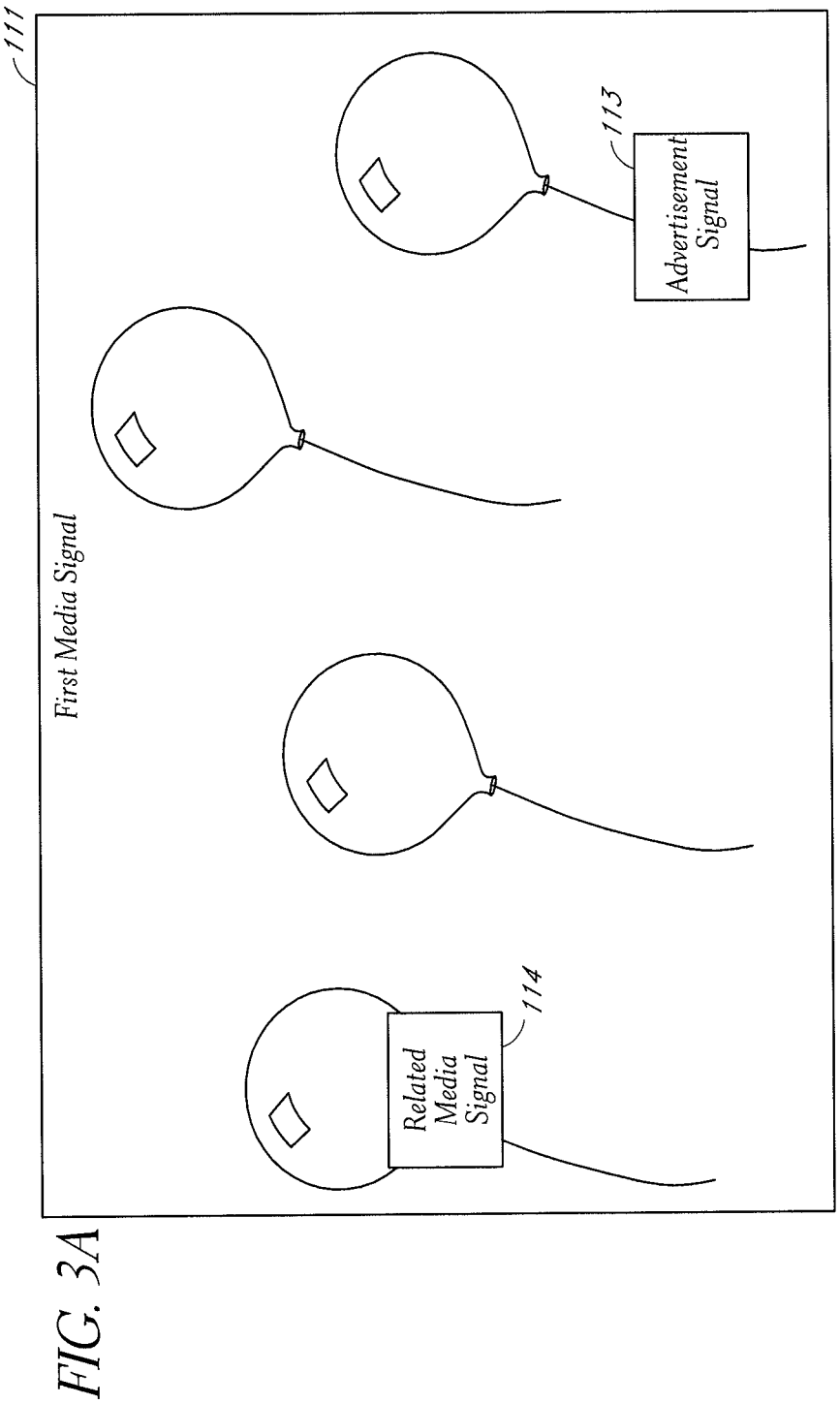
FIG. 3A illustrates one embodiment of an alternative display portion of a user interface.

An alternative display is illustrated in FIG. 3A. The primary device 3 can present the advertisement signal 113 and the related media signal 114 overlaid on the first media signal 111. The display selection module 406 can comprise criteria for the placement of the advertisement signal 113 and/or the related media signal 114 so as to optimize the viewing experience. This may involve placing the signals in set positions on the periphery of the first media signal 111, dynamically changing their placement according to characteristics of the first media signal 111, and/or the like.

More generally, as illustrated in FIGS. 3 and 3A, the advertisement and/or related media signals 113, 114 can be provided in the interstices of a first media signal 111. These interstices can be based on time, location, content and/or form of media. Alternatively, the advertisement and/or related media signals 113, 114 can be provided overlapping with the first media signal 111.

Referring back to FIG. 3, the primary device 4 comprises a plurality of buttons 462. In addition to buttons 462, some embodiments can comprise other input sensors to allow user input. These sensors 403 allow the primary device 4 to provide interactive media contained in the related media signal 114, advertisement media signal 113, and/or the first media signal 111. The sensors 403 can communicate with the computing system 400 (as illustrated in FIG. 2) which can then create a device response signal sent to the media association system 2 through the network 410. The media association 2 can respond to that with another related media signal 114 or advertisement signal 113, which can be displayed to the user so as to create a truly interactive experience for the user. Alternatively, this interactive signal set could be provided to the primary device 4 in the initial related media signal 114 or advertisement signal 113, such that the primary device 4 can respond to input from sensors (such as the buttons 462) without needing to communicate with the media association system 2. The interactive signal set can also configure the primary device 2 to communicate with ancillary devices 5, through the ancillary devices 5 to the media association system 2, through the media association system 2 to the ancillary devices 5, through either of these to other entities, or directly with other entities so as to create an interactive experience for the user. It will further be clear that an interactive signal set can comprise some combination of these communication methods.

As illustrated in FIG. 3, above the display panel 450 the primary device 4 comprises a speaker 453 and below the display panel 450 the primary device 4 comprises a microphone 461. Other input sensors and/or output modules can be provided through a connection to an ancillary device 5. For example, if a media signal 114 and/or an advertisement media signal 113 cannot viewed on the primary device 4, then a user can view the media signal 114 and/or the advertisement media signal 113 on an ancillary device 5. In other embodiment, the primary device 4 will modify the media signal 114 and/or an advertisement media signal 113 in order to display the media content on the primary device 4. Additionally, the primary device can also ignore the media signal 114 and/or an advertisement media signal 113 if the media content cannot be displayed on the primary device 4.

As further depicted in FIG. 3, the primary device 4 can be connected to an ancillary device 5, depicted here as a personal computer connected by a wire data connection 470. The first media signal 111 can be stored using a mass storage device 401 on the primary device 4 (depicted in FIG. 2) and/or on an ancillary device 5 comprising similar mass storage device. The ancillary device 5 can receive the first media signal 111 and the advertisement signal 113 directly from the first transmitter 3 and/or the media association system 2. Alternatively, the ancillary device 5 can receive the first media signal 111 and the advertisement signal 113 indirectly through the primary device 4 or some other agent. The ancillary device 5 need not acquire both signals from the same source. For example, if a user wishes to listen to a radio broadcast at a later time the user could configure an ancillary device 5 to record said first media signal 111. This configuration could be implemented indirectly through the interface on the primary device 4 or directly on an interface on the ancillary device 5. Then, the first media signal 111 could later be viewed on the primary device 4 after transmitting the recorded first media signal 111 from the ancillary device 5 to the primary device 4. Alternatively the first media signal 111 could be viewed directly on the ancillary device 5, such as when the ancillary device 5 comprises a home entertainment system. In the foregoing, the advertisement signal 113 and the related media signal 114 can be recorded, transferred, and viewed just as done with the first media signal 111. Accordingly, the advertisement signal 113 and the related media signal 114 can remain associated with the first media signal 111.

The primary and/or the ancillary devices 4, 5 in FIG. 3 can be in regular communication with the media association system 2, and accordingly a first media signal 111 stored for later viewing can be associated with an advertisement signal 113 distinct from the advertisement signal 113 associated with the first media signal 111 when viewed in real time. Whether the advertisement signal 113 is preserved or changed upon storage of the first media signal 111 can be determined by advertisement placement criteria, discussed further below. The primary device 4 can replace the advertisement signal 113 when the advertised product, service, cause, and/or event is geographically and/or temporally specific, such as presenting an advertisement for a restaurant intended to be shown slightly before lunch time to those likely to be near the given restaurant at that time of day. The advertisement signal 113 can also be replaced upon the occurrence of other criteria, such as a given user response, age, gender, language, location, time of day, type of device, user preferences, user affiliations, popularity, political affinity, cultural affinity, and/or the like. Similar actions can be made on the related media signal 114.

Although the embodiment described in this section is a radio-enabled cellular phone, it will be clear that other devices can be provided in accordance with the invention. For example, the primary device 4 could comprise a WiFi enabled receiver, laptop computer, personal digital assistant, desktop computer, television, and/or any other device capable of receiving media, displaying media, transmitting data, and sensing user inputs.

Figure 4:
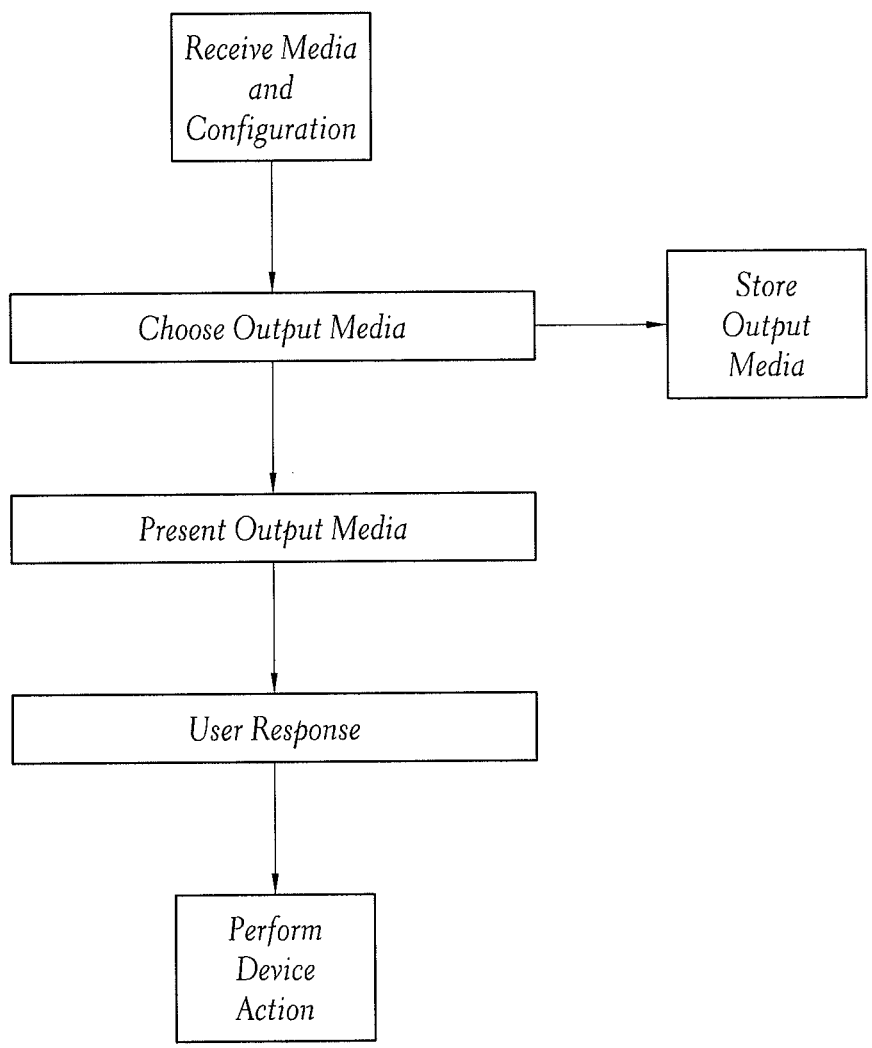
FIG. 4 illustrates a flow-chart diagram of one embodiment of a method for a device providing media to a user.

FIG. 4 illustrates a flow chart showing the actions performed by the primary device 4. The primary device 4 can receive media and/or a configuration from one of its inputs and/or through a communication method. The primary device 4 can then use the media and the configuration to choose output media. The output media can be stored and/or presented to the user. Storage of the output media could be dependent on the attributes of the primary device 4, the first media signal 111, user preferences and/or similar criteria. The user can then respond to the output media. The user's response can then cause the primary device 4 to perform an action.

Figure 4A:
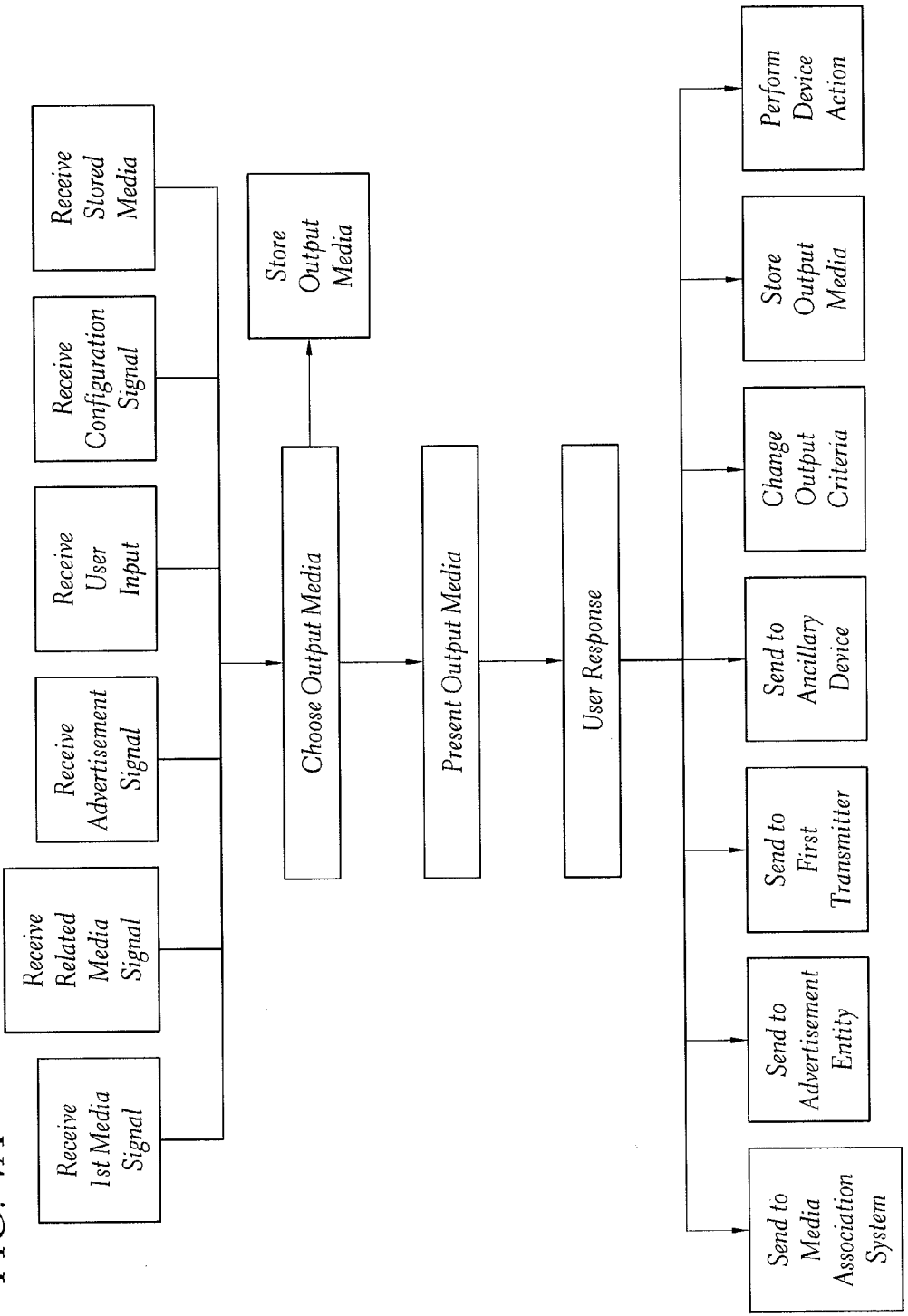
FIG. 4A illustrates a detailed flow-chart diagram of one embodiment of a method for a device providing media to a user.

FIG. 4A illustrates a more detailed flow chart showing the actions performed by the primary device 4. It will be clear that the same actions could be provided by the ancillary devices 5. When being turned on, the primary device 4 can receive a variety of inputs, comprising a first media signal 111, a related media signal 114, an advertisement signal 113, a user input, a configuration signal, and/or stored media. Each of these signals can comprise or be translatable into media that can be provided to the user. Examples of this comprise media provided through the media signals, stored media, pre-programmed media responses to user inputs, media responses to new configurations, and/or the like. Additionally, the inputs can cause a change of the primary device's configuration, such as by a signal from the media association system 2, advertisement entity 6, the first transmitter 3, an ancillary device 5, the control management system 100 and/or other sources. Such a signal may comprise machine readable code, or instructions for machine readable code already on the primary device. Alternatively, user inputs could alter the configuration of the primary device in a similar manner.

Referring further to FIG. 4A and FIG. 2, the display selection module 406 can use the incoming media, user inputs, and/or its own configuration to choose output media. For example, a computer may be configured by the user to a "mute" setting, and when the computer receives an incoming media signal with both audio and video, the computer may output the video and not the audio. In another example, an interactive television system may receive multiple video signals from both a first transmitter 3 and a media association system 2. The interactive television system can also receive a configuration signal from the media association system 2 with criteria stating what a user may and may not watch. The interactive television system could then, upon user input for selecting a channel, either display the video signal on that channel from the first transmitter, or instead an advertisement media signal 113 from the media association system 2 if the user is not permitted to view that channel. Further configurations could overlay advertisement and/or the related media signals 113, 114 on a first media signal 111. Additionally, the display selection module 406 can be configured to store one or more media signals for later viewing.

When presented with the output media, the user can provide a response, as illustrated in FIG. 4A. The user response can be based on intentional action or inaction, and/or the response can be caused by the user or the user's environment. The response can comprise user reactions or user commands, detected by the primary device's sensors. These responses can then be used by the primary device 4 to change its output criteria, choose media to be stored, or choose to perform some other action of which the device is capable. Additionally, the primary device 4 can relay these responses, or some function thereof, to the media association system 2, the advertisement entity 6, the first transmitter 3, the ancillary device 5, the control management system 100 and/or the like. For example, the primary device 4 can report to the media association system 2 when the user chooses to view the first media signals 111 from a different first transmitter 3 (for example, the user changes stations).

Media Association System

Referring back to FIG. 1, the media association system 2 can comprise the device components illustrated for the primary device 4 as depicted in FIG. 2. The media association system 2 can also be a plurality of media association systems 2, wherein each device performs similar and/or distinct functions to be described below.

Figure 5:
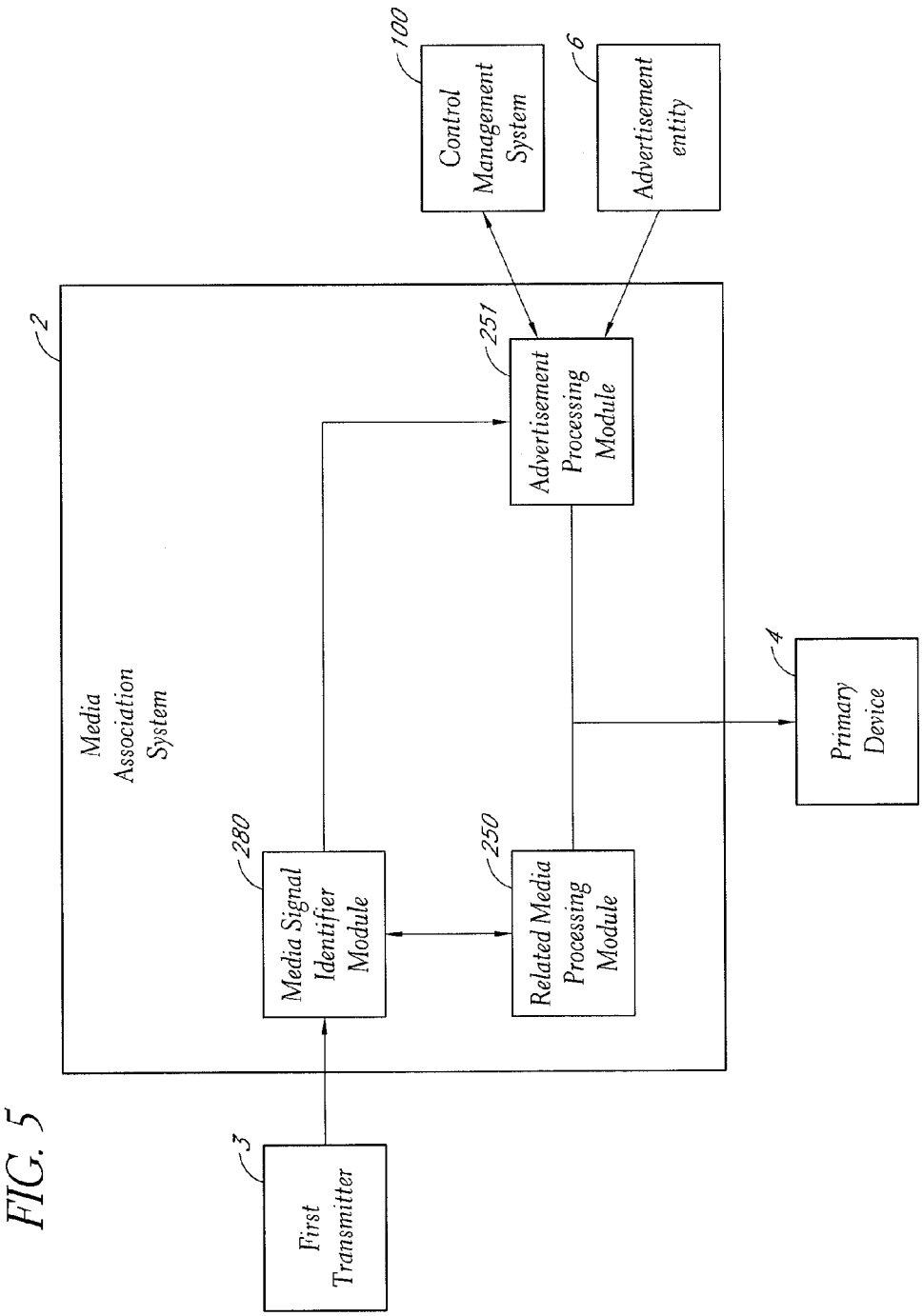
FIG. 5 illustrates a block diagram of one embodiment of a media association system.

FIG. 5 illustrates a block diagram of an embodiment of the media association system 2. The media association system 2 can receive from the first transmitter 3, the first media signal 111 or information related to the first media signal 111. This can be used by the media signal identifier module 280 to identify the contents of the first media signal 111, or certain characteristics thereof. That information can then be forwarded to a related media processing module 250, which can then choose what media content to forward to a primary device 4, and put said media in proper form for transmission.

As further depicted in FIG. 5, a media association system 2 can also receive advertisement signals 113 and/or advertisement criteria from an advertisement entity 6. This information, along with information from the media signal identifier module 280, can be provided to an advertisement processing module 251, which uses the information to perform functions that can be similar to or different from those performed by the related media processing module 250. The media association system 2 can use the information related to a first media signal 111, an advertisement signal 113, and/or the advertisement criteria, and using or processing the information to select media to be sent to the primary device 4. In one embodiment, advertisement criteria is created and/or managed in the control management system 100. In another embodiment, advertisement criteria is created and/or managed in the advertisement entity 6. In another embodiment, advertisement criteria is created and/or managed through combined use of the control management system 100 and the advertisement entity 6.

Figure 5A:
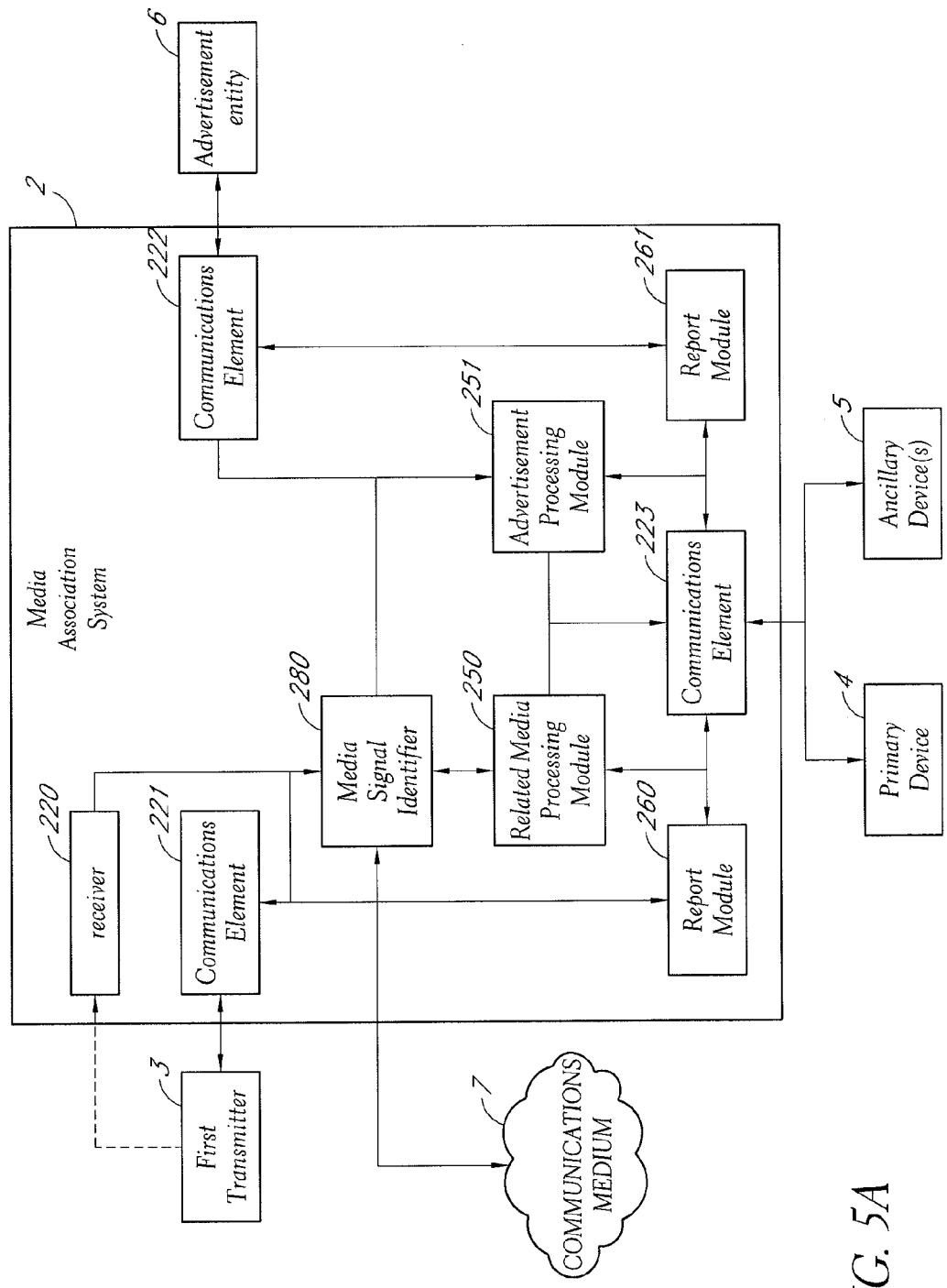
FIG. 5A illustrates a more detailed block diagram of one embodiment of a media association system.

FIG. 5A illustrates a block diagram of a more detailed embodiment of a media association system 2. As depicted in FIG. 5A, the media association system 2 can send information to the primary device 4 and/or to any ancillary devices 5. These communications can be established through communications element 223 comprising any of the communication methods discussed, or the like. The communication methods used can be the same, or can be different between each communications element 223 for each direction of communication. Advantageously, the media association system 2 can transmit directly to a given primary and/or ancillary device 4, 5, thus customizing content to that device and/or that user.

Further, as depicted in FIG. 5A, the communications need not be specifically directed toward one primary or ancillary device 4, 5 or specifically directed toward the media association system 2. For example, the media association system 2 can send a related media signal 114 or advertisement signal 113 through communications elements 223 to a plurality of primary devices 4 and/or ancillary devices 5, such as by broadcast radio whether analog or digital, satellite, cable, HSDPA, GPRS, a publicly available internet website, and/or some other openly accessible medium and/or communication method. Similarly, the signal can be sent directly to a given primary and/or ancillary device 4, 5, but not necessarily customized to the device. If desirable, the signal can then be customized by the primary and/or ancillary device 4, 5 via a display selection module 406 on the primary and/or ancillary device 4, 5 (depicted in FIG. 2), such that a portion of the related media and/or advertisement signals 113 are presented to the user. The signal ultimately presented to the user can frequently and/or periodically be customized for said user by the display selection module 406, which can be downloaded from the media association system 2, edited by the media association system 2 via a data signal (for example, from the media association system 2), edited by the user, edited through use of a conditional access portal and/or database server such as the control management system 100, and/or modified in some other way.

The media association system 2 as depicted in FIG. 5A provides a related media signal 114 to the primary and/or ancillary devices 4, 5 via a communications element 223. The communications element 223 can use a communication method to provide media to the primary and/or ancillary devices 4, 5, and to receive information from said devices. The related media signal 114 sent via the communications element 223 can be determined by a related media processing module 250. The related media processing module 250 can receive information from the media signal identifier module 280, the communications element 223, the internet 7, and/or other sources. These connections allow the related media processing module 250 to acquire information not stored on the media association system's mass storage device (not shown) or in the information transmitted by the first transmitter 3 (discussed below). For example, in the context of an SMS message as a first media signal 111, the related phone number and/or the text of the message might not fully identify the identity of the sender. In this example, the related media processing module 250 may connect to a remote phone listings database to associate the phone number with a sender name, address, and/or other relevant information. As another example, in the context of radio the first media signal 111 may come with an accompanying RBDS and/or RDS signal, but not with album art. If the memory storage unit does not store album art or does not store album art for the particular song being played, then the media association system 2 can access the internet 7 to automatically download the album art and prepare it for transmission to the primary and/or ancillary devices 4, 5.

The related media processing module 250 in FIG. 5A can also perform the task of deciding what media to provide to different primary and/or ancillary devices 4, 5. The related media processing module 250 can use a set of user display criteria, based on pre-determined user preferences, bandwidth restrictions, broadcaster preference, artist preference, copyright access, the media association system's operator's preference, age, gender, language, location, time of day, type of device, user preferences, user affiliations, political affinity, cultural affinity, popularity, and the like, and/or any other criteria discussed herein. Notably, embodiments equipped for communication from the primary and/or ancillary devices 4, 5 to the media association system 2 can update these criteria based on a user response constantly or intermittently, via the communications element 223.

The related media processing module 250 depicted in FIG. 5A can also prepare the related media for transmission to the primary and/or ancillary devices 4, 5. Such preparation can comprise encryption, compression, reformatting, and/or any other data processing method that can change the size, form, accessibility, and/or content of the related media signal 114. Such steps can reduce bandwidth requirements, restrict access to the related media signal 114, and allow it to be viewed on the primary and/or an ancillary devices 4, 5 capable of viewing media in a certain set of formats.

As illustrated in FIG. 5A, the related media processing module 250 can obtain and/or receive information relating to the first media signal 111 from the media signal identifier module 280. The media signal identifier module 280 can obtain and/or receive information relating to the first media signal 111 from the first transmitter 3 via either the receiver 220 and/or the communications element 221. The communications element 221 can allow two-way communication between the media association system 2 and the first transmitter 3, while the receiver 220 can allow one-way communication, such as by receiving a publicly available radio or television signal. Two-way communications allow the media association system 2 to request specific information and provide the first transmitter 3 with information regarding user responses, discussed further below. The media signal identifier module 280 is also connected to the internet 7, allowing the media signal identifier module 280 to obtain outside information to identify the first media signal 111. Although not illustrated in FIG. 5, the media signal identifier module 280 can also receive similar information from the primary and/or ancillary devices 4, 5. When the media signal identifier module 280 cannot obtain sufficient information from the first transmitter 3 to identify the first media signal 111, the media signal identifier module 280 can obtain further information related to the first media signal 111 from the primary and/or ancillary devices 4, 5.

In addition to or in place of the related media signal 114, as illustrated in FIG. 5A the media association system 2 can send an advertisement signal 113 to the primary and/or ancillary devices 4, 5 in the same ways that the related media signal 114 can be sent. The advertisement signal 113 is determined by an advertisement processing module 251. The advertisement processing module 251 receives information regarding the first media signal 111, or a representation thereof such as an identifier 115, from the media signal identifier module 280. Additionally, the advertisement processing module 251 receives advertisement signals 113 and/or advertisement criteria from advertising entities 6 through an advertiser communications element 222. The advertisement processing module 251 can also receive feedback from the primary and/or ancillary devices 4, 5 via the communications element 223. The advertisement processing module can then use the advertisement criteria from the advertisement entity 6, information regarding the first media signal 111 from the media signal identifier module 280, and/or signals transmitted from the primary and/or ancillary devices 4, 5 to determine which advertisement media to send to the primary and/or ancillary devices 4, 5. The advertisement processing module 251 can be substantially similar to the related media processing module, or it can comprise other elements. As with the related media signal 114, the advertisement signal 113 can be stored in a memory storage unit on the primary and/or ancillary devices 4, 5, or be modified by the primary and/or ancillary devices 4, 5, prior to presentation to the user. In one embodiment information identifying the first media signal 111, the advertisement signal 113, the related media signal 114, the unique identifier 115, time of receipt and/or interactive selection options such as organization of options in a menu system can be stored in a memory storage unit on the primary and/or ancillary devices 4,5 for retrieval at a later time and display by as desired by the user. Key word search capabilities and/or time based first-in-last-out methodologies can be employed for ease of access.

The media association system 2 depicted in FIG. 5A can provide an advertisement entity 6 interface through communications 222, further discussed below. This interface can comprise a conditional access website and/or web portal, WAP portal, form letter, automated phone system, and/or some other mechanism for allowing advertisement entities 6 to automatically send advertisement criteria and/or signals and receive feedback from the media association system 2. In one embodiment, the media association system 2 may operate discretely from the control management system 100. In another embodiment, the media association system 2 may operate in logical combination with the control management system 100. In another embodiment, the media association system 2 can operate as a portion of the control management system 100.

As illustrated in FIG. 5A, the media association system 2 can additionally comprise one or more report modules 260, 261 connected to the communications element 223. The report modules 260, 261 allow the media association system 2 to transmit user feedback from the primary and/or ancillary devices 4, 5 to the first transmitter 3, the control management system 100 and/or the advertisement entity 6. The report modules 260, 261 can condense, transform, encrypt, and/or otherwise change the form or content of this data (customizable for each) before passing it along to the first transmitter 3, the control management system 100 and/or the advertisement entity 6. The first transmitter 3, the control management system 100 and/or the advertisement entity 6 can then use this information to determine what signals and/or criteria to provide to the primary and/or ancillary devices 4, 5, and/or to the media association system 2.

Figure 6:
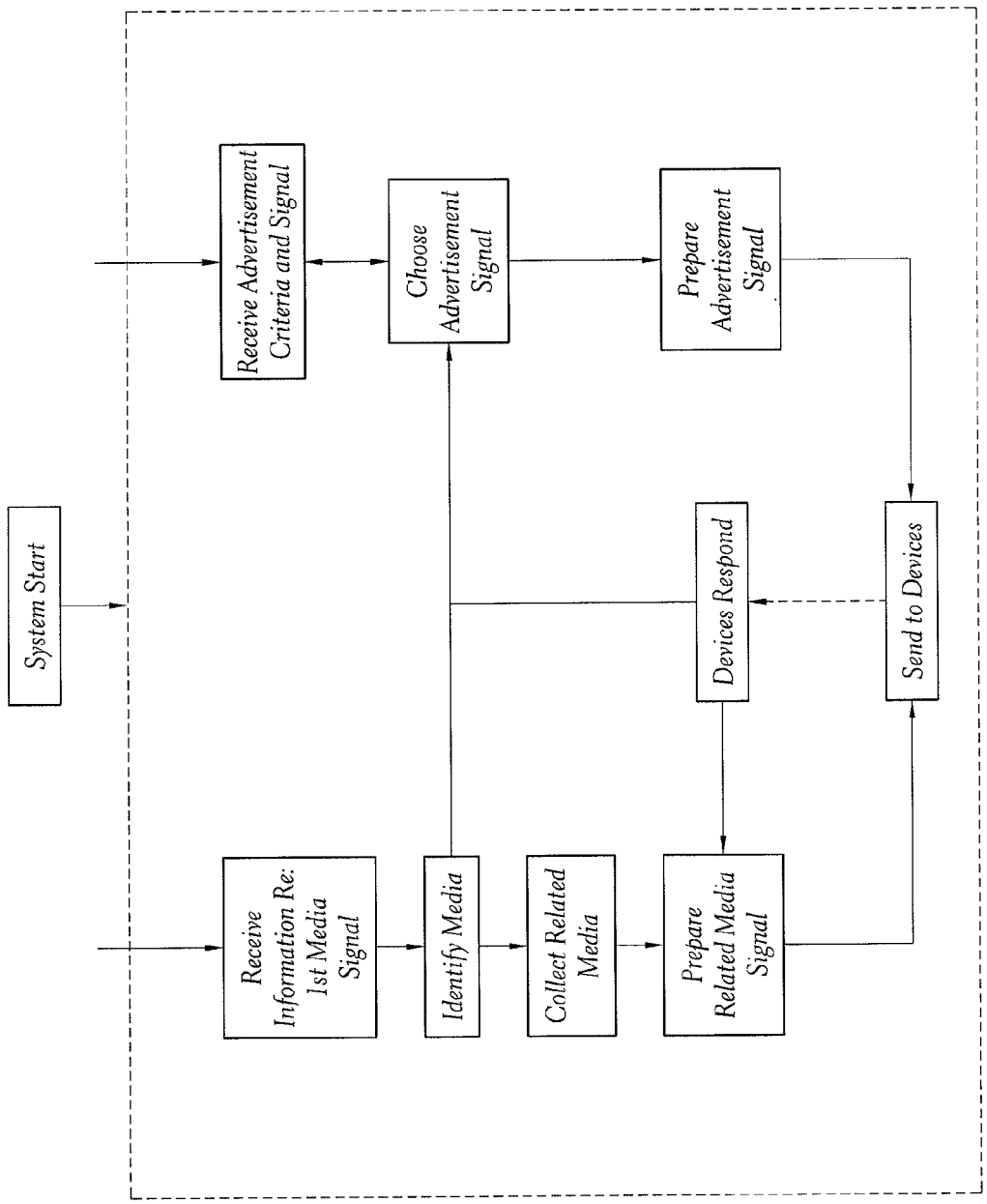
FIG. 6 illustrates a flow-chart diagram of one embodiment of a method for choosing media to provide to user devices.

FIG. 6 illustrates a flow diagram for an embodiment of the media association system 2. The system can be started by turning on the power, providing a command to start a given software module, or the like. The media association system 2 can then receive information relating to the first media signal 111, the advertisement signal 113, and/or the advertisement criteria. Information obtained relating to the first media signal 111 can comprise data related to the media signal's current programming, further comprising but not limited to the title of the program, artists, advertiser, ad, song, movie, program length, start times, end times, other information relevant to the program, and/or simply the program itself. The foregoing information pertaining to the programs can also be transmitted by the first transmitter 3. If the first transmitter 3 transmits the foregoing related information in a signal publicly available, then the media association system 2 can advantageously retrieve the information without requiring a separate communications link with the first transmitter 3. Additionally, the primary and/or ancillary devices 4, 5 can obtain this information independent of the media association system 2. The information related to the first media signal 111 need not be transmitted from the first transmitter 3 constantly, and could instead be transmitted at regular or irregular intervals, in which case the media association system 2 can store said information in a memory storage unit.

In the case where the only information available is the actual first media signal 111, or when the associated media signals 112 are otherwise inaccessible, the step of identifying the first media signal illustrated in FIG. 6 can comprise using the first media signal 111 itself to identify the contents of the media signal. For example, a radio station may verbally announce the title of a song prior to playing said song, and therefore the media signal identifier module 280 can use a voice-recognition module or a person listening to the broadcast to input or identify the contents of the first media signal 111. Alternatively, the media signal identifier module 280 could maintain a database containing recordings of content that might be presented by a first transmitter 3, and use statistical and/or non-statistical methods to compare the transmitted first media signal 111 and/or recorded content to identify the contents of the first media signal 111. Methods for identifying first media signal 111 contents can comprise human recognition, least-squares spectral analysis (LSSA), hash sums, or other operations comparing the first media signal to recorded content. Similar operations can also be performed without a full recording of the content, but instead appropriate information related to the content. When other information regarding the first media signal 111 is available, using these methods can also be used for redundancy and/or error-checking.

In some instances it may not be necessary to fully identify the first media signal 111 as illustrated in FIG. 6. For example, to choose appropriate accompanying signals it may be sufficient to identify the genre or topic of the first media signal 111 such as sporting events, political events, weather and/or news topic. As such, the media association system 2 can identify some characteristic of the first media signal 111. When the foregoing is not possible, the accompanying media can be chosen based on default criteria.

Referring to FIG. 6, once the first media signal 111 has been sufficiently identified the media association system 2 can collect and/or store the information and/or data related to the media signal 111 to be eventually provided to the primary and/or ancillary devices 4, 5. This related media can comprise media also transmitted by the first transmitter 3, media stored in a mass storage device on the media association system 2, or media collected from other sources such as the internet, other data connections, and/or by physical means.

FIG. 6 illustrates that after the media association system 2 has collected related media, the media association system 2 can prepare a related media signal 114. This can involve editing, truncating, reordering, combining, and/or performing similar operations on the related media signal 114. Additionally, it can involve putting the related media signal 114 in a proper format, as done by the related media processing module 250 in FIG. 5A. Criteria or the filter for choosing what related media to provide to the primary and/or ancillary devices 4, 5, and in what format to do so, can comprise settings chosen by the user and reported by a primary and/or ancillary device 4, 5, and other data about the user further discussed below.

The device responses depicted in FIG. 6 provide information used to amend criteria for preparing the related media signal 114. Thus, the media association system 2 can amend and/or calibrate criteria continuously, with the possibility of converging on a set of criteria that is optimal for each user or any given subset of users according to criteria discussed further below. The responses can be modified, condensed, encrypted, and/or transformed in some other way prior to transmission between any element and/or module.

Also in FIG. 6, the media association system 2 can receive at least one advertisement signal 113 and/or advertisement criteria from an advertisement entity 6. The media association system 2 can use this information, and possibly also the identity of the first media signal, to choose an advertisement media signal 113 to be transmitted to the primary and/or ancillary devices 4, 5 based on preselected criteria. This advertisement media signal 113 can then be prepared for transmission and, with or without the related media signal 114, sent to the devices 4, 5. Alternatively, the related media signal 114 can be sent without an advertisement signal 113. The criteria or filter for choosing an advertisement signal 113 can be constantly refined. In general, the method for providing an advertisement signal 113 can comprise any of the methods by which the related media signal 114 can be provided, although they do not need to be provided in the same way in any single embodiment.

To determine rules for choosing which advertisement media signals 113 to provide to the devices at any given time, advertisement entities 6 provide a set of advertisement criteria as illustrated in FIG. 6. The advertisement criteria can associate a given advertisement signal 113 and/or advertisement identifier 115 to certain content, users, times, geographies, sources, and/or other categories. Criteria or filter relating to content can comprise the title of a program, artist, producer, length, genre, lyrics, and/or keywords therein, and/or other characteristics. Criteria or filter relating to users can comprise demographic data, such as age, sex, income, race, zodiac sign, type of device, time of day, location, language, affiliations and/or club memberships, marital status, religion, cultural affinity, political affinity, popularity, user preference, place of residence, hometown, and/or other data.

Other demographic data comprises media event history of the user, media event history of the device, media stream content history, media stream transmitter history, alternate media stream content history, device history, prior interactions of the user based on past associations, promotional campaigns, previous, on going, and/or anticipated future events, demographic information associated with the source of the first media signal 111, demographic information associated with the collective users of the first media signal 111, demographic information from research providers, and/or the like.

Other criteria includes, but is not limited to, media stream producers, media stream artists, media stream consumers, benefits of associating one media stream with another, professional studies or psychographic data, availability, costs, signal strength, opportunity costs, geographic information, contractual obligations, intellectual property rights, genre, and/or the like. Criteria relating to users can further comprise data collected by the devices, such as choosing to turn off the device, change the volume, change the station, and/or provide any other response, upon receiving a first media signal 111, a related media signal 114, and/or an advertisement media signal 113.

Criteria relating to times can comprise the length, date and/or time of transmission at the source, date and/or time of reception at the user device, date and/or time of viewing of a given media signal, as well as date and/or time relative to of the media signal relative to other media signals, including but not limited to prior, current, or future transmissions of media signals, date and/or time of prior, current, or future events, date and/or time of one criteria relative to another criteria, and/or the like.

Criteria related to geography can comprise the location and/or past locations of the first transmitter 3, the advertisement entity 6, the primary and/or ancillary devices 4, 5, or the user's home, place of work, billing address, and/or other locations associated with the user. Storing the primary and/or ancillary device's 4, 5 past location histories can indicate travel habits as well as current direction, language in a location, velocity, and/or regional associations. Criteria relating to source can comprise characteristics of the first transmitter 3, comprising first transmitter identity, signal strength, signal quality, signal type; for example, digital vs. analog, media form, usual genre, Nielsen ratings, and/or other characteristics. Other criteria sources can comprise the advertisement entity's 6 willingness to pay, the related advertisement media signals 113 (such as package advertisements or advertising campaigns), the advertised products, services, causes, and/or events that conflict with the interests of another advertisement entity 6, and/or the interests of the operator of the media association system 2, and/or any other criteria.

The foregoing should not be considered an exhaustive list of possible criteria for choosing what advertisement media signal 113 is sent or provided to a given device 4, 5. The foregoing criteria or filter elements can be used singularly or in combination with each other. The criteria used to determine the media content to be associated with the first media signal 111 can involve the assignment of weighting factors to some criteria, and/or can be dynamic changed, for example, where the status of one criterion determines the weight to assign to another criterion. Access to criteria selection and/or weighting factors could be through the use of the internet, data entry, paper, telephone, text messaging, and/or any other means of conveying information into the system. The analysis can be static where the criteria are evaluated independently of each other. The analysis can change with time, events, and/or the like.

In some embodiments, the analysis comprises the ability to anticipate criteria conflicts and/or the ability to resolve criteria conflicts. An example of a criteria conflict would be demonstrated when a filter or criteria dictates that two discrete secondary media signals be paired with a single first media signal. Resolution can be made by prioritizing one of the secondary media signals over the other; using additional criteria to resolve the conflict; dividing the association of the secondary media streams to the first media stream by time, location, demographics, language, number of devices, randomness, or the like. The division does not have to be equal, and/or can favor one media signal over another.

To provide an advertisement selection process, some embodiments are configured to analyze user responses reported by the primary and/or ancillary devices 4, 5 to amend the advertisement selection process criteria (as well as the related media signal selection criteria). In some embodiments, it is advantageous to first condense advertisement criteria parameters and/or data collected by the devices into a variety of statistics, such as the estimated probability of a given response to a given signal or the estimated revenue from a given signal. To further improve data mining capabilities, some primary and/or ancillary devices 4, 5 can send to the media association system 2 over communications element 223 a complete report similar to a keystroke log combined with a log of viewed media, data, and/or advertisements. In other embodiments the foregoing data is condensed before transmission.

When receiving the response data from the primary and/or ancillary devices 4, 5, the advertisement processing module 251 can use various statistical methods to estimate the likely success of a given advertisement media signal 113 and/or related media signal 114. Success can be measured by user responses, such as eliciting or obtaining an increase in volume, not eliciting or obtaining a decrease in volume, eliciting a sale of an advertised product, a charge for each user response or click through to an advertiser or other results. Statistical techniques used can comprise generalized least squares regression, profit models, logic models, and/or other linear statistical techniques, as well as non-linear statistical methods. It may also be advantageous to comprise interactions between distinct variables, such as the effect of one variable on the effect of another variable on the success criteria. In other embodiments, other techniques could be used comprising holistic and/or non-mathematical methods.

It will be clear that these methods for measuring the anticipated user response to advertisement media signals 113 can also be used to measure the anticipated user response to related media signals 114 and/or first media signals 111. Such methods allow the media association system 2 to advantageously provide optimal signals desirable to users, thus enhancing the value of the product.

Taking all, substantially all, or some of these criteria together, the related media and/or advertisement processing modules 250, 251 can choose advertisement and/or related media signals 114 optimized for achieving a certain goal. Such goals may comprise boosting responses to advertisement media signals 113, increasing viewing by users, increasing revenue from advertisement entities 6, increasing user responses or click throughs to advertisement media signals 113 to increase per response revenue and/or other goals.

Additionally, the media association system 2 in FIG. 5A and/or the signal selection process in FIG. 6 can be modified such that the advertisement signal 113 is selected knowing its accompanying related media signal 114, the related media signal is selected knowing its accompanying advertisement signal 113, or the two are selected as a pair. Such a system will be advantageous in that the two signals (advertisement message 113 and related media signal 114) can be coordinated to avoid clashing colors, excessive stimuli, and/or other coordination problems. However, choosing the signals independently can sometimes require fewer computational resources by providing a smaller number of choices to be considered.

Thus, the media association system 2 can be configured to choose the signals in any of these ways, depending on its available resources.

The process depicted in FIG. 6 of selecting an advertisement signal 113 to coincide with a given portion of the first media signal 111 can cause the advertised product, cause, or idea to become psychologically associated with the content of the first media signal. It may be desirable to provide the advertisement media signal 113 to the primary device 4 prior to the termination of the desired portion of the first media signal 111, so as to enhance the psychological connection between the two media signals. However, providing the advertisement media signal 113 shortly before or after the related first media signal 111 can still have an effect. Similarly, if a first media signal 111 is sufficiently memorable and the advertisement media signal 113 is sufficiently related, it may be desirable to provide an advertisement signal 113 a set time period after the first media signal 111 so as to evoke positive memories. Providing an advertisement media signal 113 in anticipation of a first media signal 111 can also provide benefits in accordance with the invention, such as to promote a future media program on the same or a different station or a program transmitted by an entirely different communication method.

The method depicted in FIG. 6 can provide the advertisement signal 113 from a source distinct from the first transmitter 3. This allows one to associate advertisement signals 113 not necessarily the same as advertisement signals 113 provided by the first transmitter 3. Thus, for example, a radio transmission without graphical advertisements from the first transmitter 3 can be augmented with graphical advertisements provided by the media association system 2. Alternatively, a television broadcast from the first transmitter 3 can have advertisements specifically determined by the media association system 2, perhaps targeted to a specific region, market, language, age, gender, political party, cultural affinity, and/or set of viewers. The media association system 2 can thus tailor advertisement media signals 113 to each individual, independent of or in conjunction with the first transmitter 3.

Advertisement Entity

Referring back to FIG. 1, the advertisement entity 6 can comprise corporations, companies, partnerships, agencies, firms, organizations, public entities, non-profit organizations, individuals, and/or any other entity, including the operator of the media association system 2 and/or the first transmitter 3. Similarly, the advertisement signals 113 can advocate a product, service, cause, and/or event, promote awareness of an idea or issue, and/or comprise any other form of communication method. In some embodiments, the advertisement media signal 113 can be assigned a unique advertisement identifier 115 to facilitate communication, data processing, and/or data mining.

The communications between the advertisement entity 6 and the media association system 2, depicted in FIGS. 1 and 5A can go through an interface provided by the communications element 222. The interface can comprise a webpage or web portal, WAP portal, paper form, automated telephone system, a person, and/or any other form capable of transmission through a communication method. Through the interface, the advertisement entity 6 can set advertisement criteria discussed above, such as when a given advertisement signal 113 should be provided. Additionally, the interface can allow the advertisement entity 6 to upload or send new advertisement media signals 113 remotely. Thus, an advertisement entity 6 can constantly update its advertisement media signals 113. The interface can also provide information back to the advertisement entity 6 from the media association system 2, comprising billing information and usage and/or response feedback from the primary and/or ancillary devices 4, 5. This information can be provided in whole, or in condensed forms such as numerical statistics, pie charts, bar graphs, text, and/or any other media. As with the related media signal 114 and the primary device 4, the interface with the advertisement entity 6 can be determined by criteria deriving from either the advertisement entity 6 and/or the media association system 2. The interface can further comprise modules that allow a user to access data through the use of stylized screen elements such as, for example, menus, windows, dialog boxes, toolbars, controls (for example, radio buttons, check boxes, sliding scales, combinations of the same, or the like), and/or the like.

Figure 7:
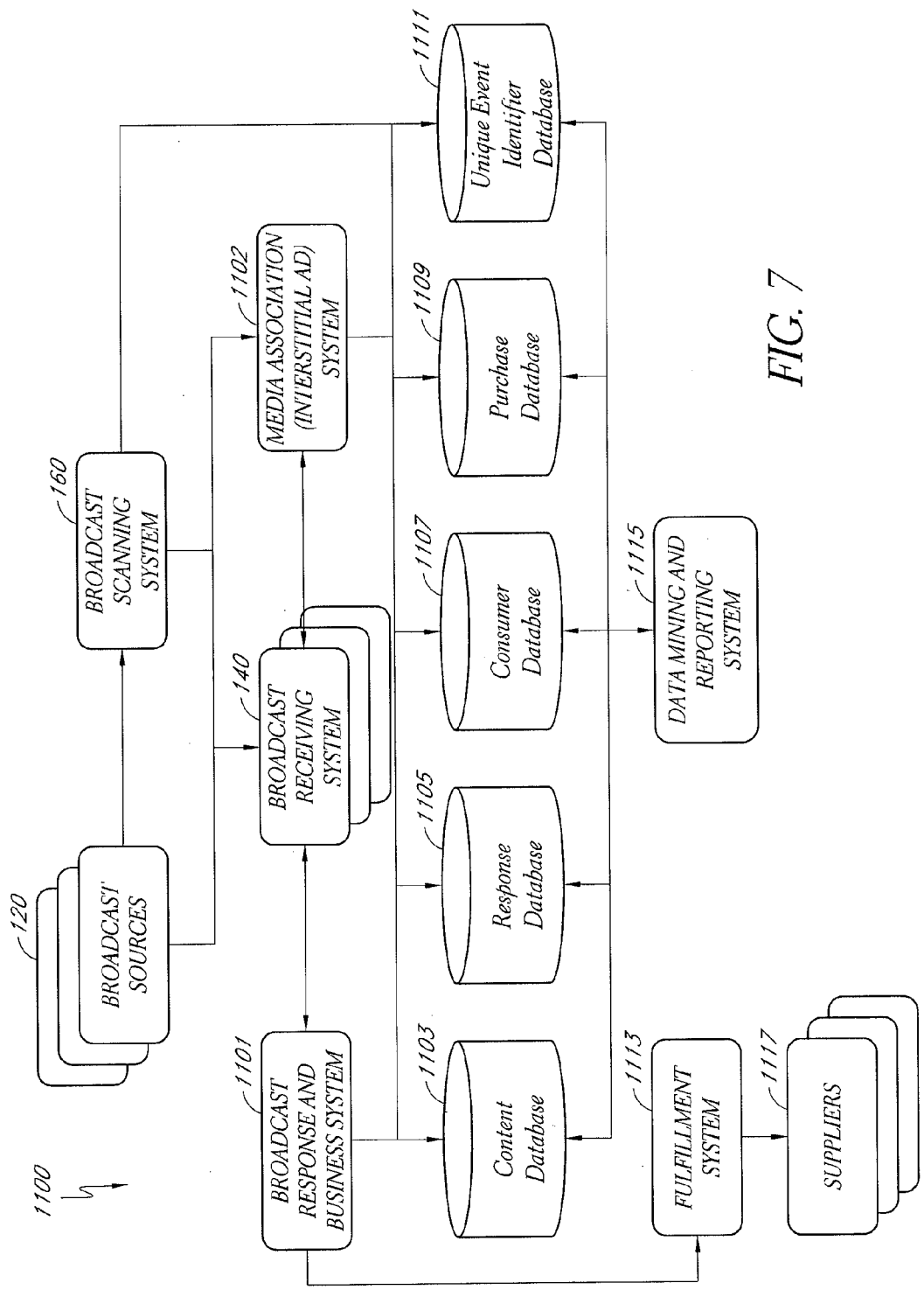
FIG. 7 illustrates one embodiment of a media enhancement system in the context of one embodiment of a broadcast response and business system.

With reference to FIG. 7, the various embodiments of the media enhancement system may be used in a variety of systems and/or contexts. FIG. 7 illustrates such an example context. In the illustrated example, a plurality of broadcast sources 120 broadcast various media content in a plurality of broadcast streams, which are received by the broadcast scanning system 160. In one embodiment, the broadcast scanning system 160 is configured to: analyze the broadcast streams received from the plurality of broadcast sources 120 to obtain or identify the media content transmitted in the broadcast streams; obtain additional information about the media content if available; and/or assign a unique event identifier 115 specific to the broadcast of each specific broadcast stream. In one embodiment, the broadcast scanning system 160 transmits the unique event identifier 115 to the media association (advertisement) system 1102. Methods and systems of how the broadcast scanning system 160 obtain or generate the unique event identifier 115 are disclosed in detail in co-pending U.S. patent application Ser. No. 12/366,483, filed Feb. 5, 2009, titled "SYSTEM, METHOD, AND DEVICES FOR SCANNING BROADCASTS," which is incorporated by reference in its entirety. In one embodiment, the broadcast scanning system 160 stores the unique event identifier 115 in the unique event identifier database 1111. In one embodiment, the unique event identifier 115 that is stored in the unique event identifier database 1111 is database linked with the corresponding and/or associated content and/or content identifiers that are stored in the content database 1103.

Referring to FIG. 7, in one embodiment, the broadcast scanning system 160 further broadcasts or transmits over a network to the broadcast receiving systems 140. In one embodiment, the unique event identifier 115 is transmitted through the internet and/or over a wireless/cellular network to a mobile device operating a software application (for example, a Java J2ME software application) capable of accessing the internet through the wireless/cellular network. After a broadcast receiving system 140 receives a broadcast stream from a broadcast source 120, and receives a corresponding unique event identifier 115 from the broadcast scanning system 160, the broadcast receiving system 140 is configured to receive a user selection or user input. After the broadcast receiving system 140 receives the user selection or user input, the broadcast receiving system 140 is configured, in one embodiment, to transmit to the broadcast response and business system 1101 at least the unique event identifier 115 and/or a user identifier.

In further reference to FIG. 7, in one embodiment, the broadcast response and business system 1101 is configured to connect to the unique event identifier database 1111 in order to perform a database lookup of the received unique event identifier 115. From the database lookup, the broadcast response system 1101 can determine the broadcast source, the time and date of the broadcast, and/or the content associated with the broadcast. The broadcast response system 1101 is configured in one embodiment to locate in the content database 1103 the content and if available, the content identifier associated with the broadcast based on the database lookup. In one embodiment, the broadcast response system 1101 is configured to store the user selection or the user response in the response database 1105.

With reference to FIG. 7, if the user selected to purchase the content associated with the unique event identifier 115, then the broadcast response system 1101 is configured in one embodiment to verify the user identifier in the consumer database 1107, which stores, for example, user name, address, demographic data, and/or other similar user information. The broadcast response system 1101 in one embodiment is configured to store the purchase event in the purchase database 1109. The purchase database 1109 is configured to store, for example, past user purchases, user credit card information, user billing information, user preferences, user telephone information for billing the user cellular account, age, gender, location, mobile operator, receiving device model and/or the like. In one embodiment, the broadcast response system 1101 is configured to transmit the purchase selection to the fulfillment system 1113. The fulfillment system 1113 can also be configured to ship from a supplier 1117 to the user a physical product, for example, a CD or book, and in other embodiments, the fulfillment system 1113 is configured to inform the user where to download the content, or electronically transmits the content to the user.

Referring to FIG. 7, in one embodiment, the data mining and reporting system 1115 is configured to connect to the content database 1103, the response database 1105, the consumer database 1107, the purchase database 1109, and/or the unique event identifier database 1111 to conduct data mining and/or reporting. In one embodiment, the data mining and reporting system 1115 is configured to identify based on the unique event identifier 115 the broadcast source, the broadcast segment, and/or the time and date of the broadcast segment that produced the most user responses in a given period.

As illustrated in FIG. 7, in one embodiment, the media association (advertisement ad) system 1102 is configured to receive the unique event identifier 115 from the broadcast scanning system 160. The media association system 1102 in one embodiment is configured to identify the content associated with the unique event identifier 115 by performing a database lookup using the unique event identifier database 1111 and/or the content database 1103. The media association system 1102 can also be configured to compare the content with a database to determine whether an associated media stream or content should be transmitted to broadcast receiving systems 140 that are displaying or outputting the content associated with the unique event identifier 115. For example, the media association system 1102 is configured in one embodiment to display an advertisement next to a graphic representing a music artist and/or advertiser featured in the content received from a broadcast source 120 and outputted on the broadcast receiving system 140.

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

In certain embodiments, the acts, methods, and processes described herein are implemented within, or using, software modules (programs) that are executed by one or more general purpose computers. The software modules may be stored on or within any suitable computer-readable medium. It should be understood that the various steps may alternatively be implemented in-whole or in-part within specially designed hardware. The skilled artisan will recognize that not all calculations, analyses and/or optimization require the use of computers, though any of the above-described methods, calculations or analyses can be facilitated through the use of computers.

Although the foregoing systems and methods have been described in terms of certain preferred embodiments, other embodiments will be apparent to those of ordinary skill in the art from the disclosure herein. Additionally, other combinations, omissions, substitutions and modifications will be apparent to the skilled artisan in view of the disclosure herein. While certain embodiments of the inventions have been described, these embodiments have been presented by way of example only, and are not intended to limit the scope of the inventions. Indeed, the novel methods and systems described herein may be embodied in a variety of other forms without departing from the spirit thereof. Further, the disclosure herein of any particular feature, aspect, method, property, characteristic, quality, attribute, element, or the like in connection with an embodiment can be used in all other embodiments set forth herein. Accordingly, other combinations, omissions, substitutions and modifications will be apparent to the skilled artisan in view of the disclosure herein.

What is claimed is:

1. A system for combining multiple media content in a receiving device, the system comprising:

at least one communications element that:
receives a first media stream comprising at least a first media content;
receives a second media content obtained via a secondary media content stream discrete from the first media stream;
receives uniquely identifying data specific to the second media content; and
receives at least one criteria correlated to the second media content;

an evaluation module comprising at least one computer processor and associated location determination hardware that enables determination of a location of the receiving device, the location determination hardware utilizing at least one of the following to determine the location of the receiving device: a GPS system, a triangulation system, a geographic location system, wherein the evaluation module evaluates the at least one criteria in reference to at least the location of the receiving device determined by the location determination hardware;

an outputting device corollary to the receiving device, wherein the outputting device presents, in substantial concurrence, the first media content and the second media content, wherein the presentation of the second media content is based at least partly on the evaluation of the at least one criteria in reference to at least the location of the receiving device determined by the location determination hardware;

an input module that detects a selection associated with at least the second media content, enabling generation of a response corollary to the selection; and a transmission module that sends the response comprising at least the uniquely identifying data associated with the second media content.

2. The system of claim 1, wherein the transmission module sends at least one of the following to a media stream association system: an identification of receipt of the first media stream, a receiving device status.

3. The system of claim 1, wherein the outputting device corollary to the receiving device obtains data specific to an instance of outputting of the second media content, the input module detects a response corollary to the second media content, and the transmission module sends at least the data specific to the instance of outputting to a computer server.

4. The system of claim 1, wherein the response further comprises data that enables identification of a responder.

5. A method for associating secondary media content identifiers in a computing device with at least one of a plurality of broadcast segments, the method comprising:

storing, in an electronic memory, secondary media content identifiers, each secondary media content identifier being associated with at least one of a plurality of secondary media content;

storing, in the electronic memory, using one or more computer processors, broadcast segment identifying elements, each broadcast segment identifying element being associated with at least one of the plurality of broadcast segments;

storing, in the electronic memory, a location of the computing device, the location of the computing device derived at least in part utilizing at least one of the following to determine the location of the computing device: a GPS system, a triangulation system, a geographic location system;

associating, using the computing device, at least one of the secondary media content identifiers with at least one of the broadcast segment identifying elements, the association enabling identification of usage responsive to at least one of the following: specific associations of secondary media content with broadcast segments, the location of the computing device; and storing, in the electronic memory, at least part of the association enabling identification of usage.

6. The method of claim 5, wherein the storing of the media content identifiers and the storing of the broadcast segment identifying elements are managed by a single entity.

7. The method of claim 5, wherein the storing of the media content identifiers and the storing of the broadcast segment identifying elements are managed by discrete entities.

8. The method of claim 5, wherein the association enabling identification of the usage is performed in relation to at least one specific instance from the plurality of broadcast segments.

9. The method of claim 5, further comprising:

receiving a response corollary to at least one of the plurality of secondary media content; and updating at least one of the following: the media content identifiers, the broadcast segment identifying elements, the location of the computing device.

10. The method of claim 5, further comprising generating a report based at least in part on the association enabling identification of usage responsive to at least one of the following: specific associations of secondary media content with broadcast segments, the location of the computing device.

11. The method of claim 5, further comprising storing an identification of a responder.

12. A method for combining multiple media obtained from a broadcast stream, the method comprising:

receiving, using an electronic receiving device, at least a first media content from a broadcast stream;

receiving, using the electronic receiving device, at least a second media content, the second media content received discretely from the first media content;

determining uniquely identifying data specific to at least the second media content;

determining a location of the electronic receiving device utilizing at least one of the following to determine the location of the electronic receiving device: a GPS system, a triangulation system, a geographic location system;

presenting concurrently the first media content and the second media content using an electronic output device;

detecting at least a response input responsive to the second media content; and transmitting electronically to a computer server a response message comprising at least the uniquely identifying data specific to at least the second media content and the location of the electronic receiving device.

13. The method of claim 12, further comprising determining an identification of a specific instance of the first media content.

14. The method of claim 13, wherein the response message further comprises at least one of the following: the identification of the specific instance of the first media content, data that enables identification of a responder.

15. The method of claim 12, further comprising outputting of the first media content and second media content based on at least one criteria.

16. The method of claim 12, further comprising storing at least one of the first media content the second media content, the location of the electronic receiving device.

17. The method of claim 15, further comprising obtaining the at least one criteria for the outputting of the second media content in association with at least one specific broadcast segment.

18. The method of claim 17, wherein the at least one criteria is obtained externally.

19. The method of claim 17, wherein the at least one criteria is obtained internally.

20. The method of claim 15, wherein the at least one criteria is obtained using at least one of the following: a first communications method used to obtain the first media content, a second communications method used to obtain the second media content, internal generation.

* * * * *